(12) United States Patent
Townley et al.

(10) Patent No.: US 8,996,906 B1
(45) Date of Patent: Mar. 31, 2015

(54) CLOCK MANAGEMENT BLOCK

(75) Inventors: Kent R. Townley, San Jose, CA (US); Christopher D. Ebeling, San Jose, CA (US); Hamish Fallside, Monte Sereno, CA (US); Prasun K. Raha, Palo Alto, CA (US)

(73) Assignee: Tabula, Inc., Santa Clara, CA (US)

( * ) Notice: Subject to any disclaimer, the term of this patent is extended or adjusted under 35 U.S.C. 154(b) by 830 days.

(21) Appl. No.: 12/960,459

(22) Filed: Dec. 3, 2010

Related U.S. Application Data

(60) Provisional application No. 61/344,575, filed on May 13, 2010, provisional application No. 61/349,814, filed on May 28, 2010, provisional application No. 61/370,451, filed on Aug. 3, 2010, provisional application No. 61/389,714, filed on Oct. 4, 2010, provisional application No. 61/397,715, filed on Oct. 15, 2010.

(51) Int. Cl.
*G06F 1/04* (2006.01)
*G06F 1/10* (2006.01)
*H03K 19/00* (2006.01)
*H03K 19/173* (2006.01)

(52) U.S. Cl.
CPC ........................................ *G06F 1/10* (2013.01)
USPC ........... 713/600; 713/400; 713/500; 713/501; 326/37; 326/38; 326/39; 326/40; 326/41; 326/46; 326/47; 326/93; 326/101; 327/141; 327/142

(58) Field of Classification Search
None
See application file for complete search history.

(56) References Cited

U.S. PATENT DOCUMENTS

| | | | |
|---|---|---|---|
| 5,511,181 A | 4/1996 | Baxter | |
| 5,578,946 A | 11/1996 | Carberry et al. | |
| 5,589,782 A | 12/1996 | Sharpe-Geisler | |
| 6,097,776 A | 8/2000 | Mesiwala | |
| 6,229,337 B1 | 5/2001 | Xiao et al. | |
| 6,469,553 B1 | 10/2002 | Sung et al. | |
| 6,675,306 B1 | 1/2004 | Baxter | |
| 6,867,617 B2 | 3/2005 | Grundvig | |
| 6,882,182 B1 | 4/2005 | Conn et al. | |
| 6,959,397 B2 | 10/2005 | Cafaro et al. | |
| 6,990,598 B2 | 1/2006 | Sherburne, Jr. | |
| 7,143,377 B1 | 11/2006 | Kudlugi et al. | |
| 7,157,933 B1 | 1/2007 | Schmit et al. | |
| 7,342,415 B2 | 3/2008 | Teig et al. | |
| 7,362,135 B1 | 4/2008 | Chang | |
| 7,398,414 B2 | 7/2008 | Sherburne, Jr. | |
| 7,433,397 B2 | 10/2008 | Garlepp et al. | |
| 7,680,233 B1 | 3/2010 | Mauer | |

(Continued)

OTHER PUBLICATIONS

U.S. Appl. No. 13/802,655, filed Mar. 13, 2013, Tabula, Inc.

(Continued)

*Primary Examiner* — Tanh Nguyen
(74) *Attorney, Agent, or Firm* — Adeli LLP

(57) ABSTRACT

A novel integrated circuit (IC) that configurably distributes clocks from multiple clock sources to multiple sets of circuits is described. The IC includes multiple clock sources and multiple clock domains. Each clock domain includes a clock signal and a control signal. The clock signal is configurably selected from one of the multiple clock sources. The control signal is synchronized to the clock signal. The IC also includes multiple configurable circuits. A configurable circuit can configurably operate in one of the clock domains by selecting and using the control signal and the clock signal of the clock domain.

19 Claims, 28 Drawing Sheets

(56) References Cited

U.S. PATENT DOCUMENTS

| | | | |
|---|---|---|---|
| 7,818,705 | B1 | 10/2010 | Hutton et al. |
| 8,037,340 | B2 | 10/2011 | Kim et al. |
| 2001/0033188 | A1 | 10/2001 | Aung et al. |
| 2002/0125914 | A1 | 9/2002 | Kim |
| 2002/0169990 | A1 | 11/2002 | Sherburne, Jr. |
| 2003/0025564 | A1 | 2/2003 | Franca-Neto |
| 2003/0184339 | A1 | 10/2003 | Ikeda et al. |
| 2005/0007155 | A1 | 1/2005 | Young |
| 2005/0046458 | A1 | 3/2005 | Schroeder et al. |
| 2005/0280449 | A1 | 12/2005 | Kelkar et al. |
| 2006/0250168 | A1 | 11/2006 | Starr et al. |
| 2013/0009695 | A1 | 1/2013 | Boucard |
| 2013/0099821 | A1 | 4/2013 | Huang et al. |

OTHER PUBLICATIONS

Gayasen, A., et al., "Reducing Leakage Energy in FPGAs Using Region-Constrained Placement," FPGA '04, Feb. 22-24, 2004, pp. 51-58, ACM, Monterey, California, USA.

Hauck, S., et al., "Montage: An FPGA for Synchronous and Asynchronous Circuits," Field-Programmable Gate Arrays: Architectures and Tools for Rapid Prototyping, 1993 Month N/A, 4 pages, Springer-Verlag, Berlin.

Xilinx, Inc., "Virtex-4 Family Overview," Advance Product Specification, Sep. 10, 2004, pp. 21-30, v1.1, Xilinx, Inc.

Portions of prosecution history of U.S. Appl. No. 13/802,655, filed Oct. 10, 2014, Tabula, Inc.

Boyer, F-R., et al., "Minimizing Sensitivity to Clock Skew Variations Using Level Sensitive Latches," Month Unknown, 2001, 4 pages.

CLOCK MANAGEMENT BLOCK

CLAIM OF BENEFIT TO PRIOR APPLICATIONS

The present Application claims the benefit of U.S. Provisional Patent Application 61/334,575, entitled "Clock Management Block," filed May 13, 2010. The present Application also claims the benefit of U.S. Provisional Patent Application 61/349,814, entitled "Clock Management Block," filed May 28, 2010. The present Application also claims the benefit of U.S. Provisional Patent Application 61/370,451, entitled "Clock Management Block," filed Aug. 3, 2010. The present Application also claims the benefit of U.S. Provisional Patent Application 61/389,714, entitled "Clock Management Block," filed Oct. 4, 2010. The present Application claims the benefit of U.S. Provisional Patent Application 61/397,715, entitled "Clock Management Block," originally filed Oct. 15, 2010 as U.S. Non-Provisional patent application Ser. No. 12/906,061, for which a Petition Requesting Conversion to a Provisional Application was granted on Dec. 22, 2010. All of the above-mentioned provisional applications are incorporated herein by reference.

BACKGROUND

Modern large scale integrated circuits (ICs) are often required to implement various different functionalities. For an IC to implement each of its different functionalities optimally, it must have available different clock sources supplying different types of clocks. Sometimes the different functionalities in the IC require clocks that are of different frequencies. Sometimes the different functionalities require clocks that are of the same frequency but at different phases.

Circuit elements in the IC that operate using a same clock signal are sometimes said to be in a same clock domain. In order for circuit elements in a clock domain to function as intended, the clock signal must arrive at all storage and sequential circuit elements (e.g., flip-flops and memories) in that clock domain at precisely determined time. To accomplish this, each clock domain includes a clock distribution network, which is physically designed to ensure that each storage or sequential element in the clock domain receives the clock signal at about the same time.

In addition to the distribution network for the clock signal, a clock domain sometimes has to include distribution networks for high-fan out control signals as well. A control signal turns on or off a particular functionality in an IC, often by enabling, disabling or resetting a group of storage or sequential elements. In order for the particular functionality to behave predictably, it is important that every sequential or storage element in the group receives the control signal at the same clock cycle. This requires the control signal that controls the group of sequential or storage elements be synchronized to the clock of the clock domain. This also requires the clock domain to include a distribution network for the control signal when the number of sequential elements is large.

As ICs become larger and the functionalities implemented on the ICs become more complex, the number of clock domains has increased while the fan-outs of the control signals in the clock domains have grown. Control signals such as enable and reset have thus become high fan-out signals requiring high fan-out distribution schemes such as balance trees and pipeline stages. In many of these instances, a clock domain is defined by its control signal distribution networks in addition to its clock distribution network. These distribution networks generally have stringent timing requirements and must be physically designed into the IC prior to fabrication.

In non-configurable ICs such as Microprocessors and ASICs, interconnecting multiple circuit elements with multiple clock sources is generally manageable, because each circuit element in each clock domain has a pre-determined and non-configurable relationship with a clock source. However, in an IC that has a large number of configurable circuits (e.g., an FPGA or a PLD), the configurability of the IC requires that each of the many circuit elements be configurably paired with one of the many possible clock sources. The complexity of the required interconnections in such an IC is thus significantly greater than that of Microprocessors and ASICs. As the size of modern configurable IC has grown considerably larger, the interconnections needed to implement some or all of the possible permutations of clock/configurable circuit pairings has become nearly unmanageable.

Therefore, there is a need for efficient management of interconnections between multiple clock sources and a large number of configurable circuits.

SUMMARY

Some embodiments of the invention provide an integrated circuit (IC) that configurably distributes multiple clocks to multiple clock domains for operating multiple sets of circuits. Each clock domain can be configured to use one of the multiple clocks as a local clock. Each circuit in the IC can be configured to operate in one of several clock domains. For each clock domain, some embodiments synchronize one or more control signals with the domain's local clock and distribute the synchronized control signals to the clock domain. In some of these embodiments, each clock domain is associated with a clock management block (CMB), which generates the control signals operating in the clock domain. The local clock, the init signal and the enable signal are organized into a clock tuple for the clock domain in some embodiments.

In some embodiments, each clock domain provides the clock to one or more configurable circuits that form the IC's configurable circuit fabric. The configurable circuits can be configured to perform different functions according to different sets of configuration data. The configurable circuits in some embodiments include configurable logic circuits and configurable interconnect circuits. In some embodiments, some or all of these configurable circuits are run-time reconfigurable circuits. Examples of ICs that include real-time reconfigurable logic circuits and real-time reconfigurable interconnect circuits can be found in U.S. Pat. No. 7,295,037. In some embodiments, the IC implements a user design by running the reconfigurable circuits at a higher clock rate where one user design cycle include multiple sub-cycles of operations. In some of these embodiments, a reconfiguration signal generator is used to control the sub-cycle operations of the reconfigurable circuits in relation to the user design cycle. Some embodiments use a counter to implement the reconfiguration signal generator for the configurable circuits.

Sub-cycle operations of the reconfigurable circuits are based on sub-cycle clocks. The sub-cycle clocks are derived from primary clocks (or user clocks). In some embodiments, each sub-cycle clock is generated by a phase-lock loop (PLL), which uses a primary clock as its reference clock input. Some embodiments configurably route PLL-generated sub-cycle clocks to different clock domains as the local clocks of those domains. Each domain's CMB then uses the local clock to operate a shadow sub-cycle counter. In some embodiments, the CMB aligns its shadow sub-cycle counter with its corresponding primary or user clock by detecting the start of the primary clock cycle, which in some embodiments corresponds to an edge of the source PLL's reference clock. The CMB in some embodiments then uses its enable and init signals to align each configurable circuit's reconfiguration signal generators with the shadow sub-cycle counter.

In some embodiments, the IC includes multiple clock regions, each clock region including multiple CMBs and multiple clock domains. In some embodiments, each clock region also includes one or more PLLs as the source of the clocks. Each of these PLLs sources multiple clocks, and the clocks from these PLLs can be configurably routed to each of the clock domains in the clock region to act as the local clocks of the clock domains. Some embodiments also configurably route one or more global clocks available to all clock domains in all clock regions so that different clock domains in different clock regions can operate using the same global clock.

In some embodiments, a CMB can be communicatively coupled with other CMBs to act as either a master or a slave, where a master CMB controls one or more slave CMBs. In some embodiments, the master CMB controls a slave CMB by relaying the master CMB's state information to the slave CMB via a CMB bus. In some embodiments, a slave CMB controls its clock tuple by mimicking the master CMB's clock tuple. Some embodiments use CMBs in master-slave arrangements to synchronize the different clock domains so that the different clock domains can operate using the same user clock and be in the same sub-cycle state. Specifically, the master CMB aligns its sub-cycle state to the user clock, and the slave CMB synchronizes its sub-cycle state with that of the master CMB.

In some embodiments, sub-cycle alignment operations performed by the CMBs are part of a start-up sequence for the user-designed operation of the configurable IC. Prior to the start of the user-designed operations, the master CMB aligns its sub-cycle counter with the user clock, and the slave CMBs aligns their sub-cycle counters with that of the master. After the sub-cycle counters of the CMBs have been aligned, some embodiments then commence user-designed operations at the correct sub-cycle states.

In some of these embodiments, the IC includes a configuration controller that processes the configuration data and configures the configurable circuits through a configuration network (CN). Examples of configuration controllers and configuration networks can be found in U.S. Pat. No. 7,375,550. Some embodiments include a CMB that is dedicated to the configuration network. In some of these embodiments, the dedicated CMB includes the functionality of the configuration controller.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

Some embodiments of the invention provide an integrated circuit (IC) that configurably distributes multiple clocks to multiple clock domains for operating multiple sets of circuits. Each clock domain can be configured to use one of the multiple clocks as a local clock. Each circuit in the IC can be configured to operate in one of several clock domains. For each clock domain, some embodiments synchronize one or more control signals with the domain's local clock and distribute the synchronized control signal to the clock domain. In some of these embodiments, each clock domain is associated with a clock management block (CMB), which generates the control signals to operate in the clock domain. The local clock, the init signal and the enable signal are organized into a clock tuple in some embodiments.

Figure 1:
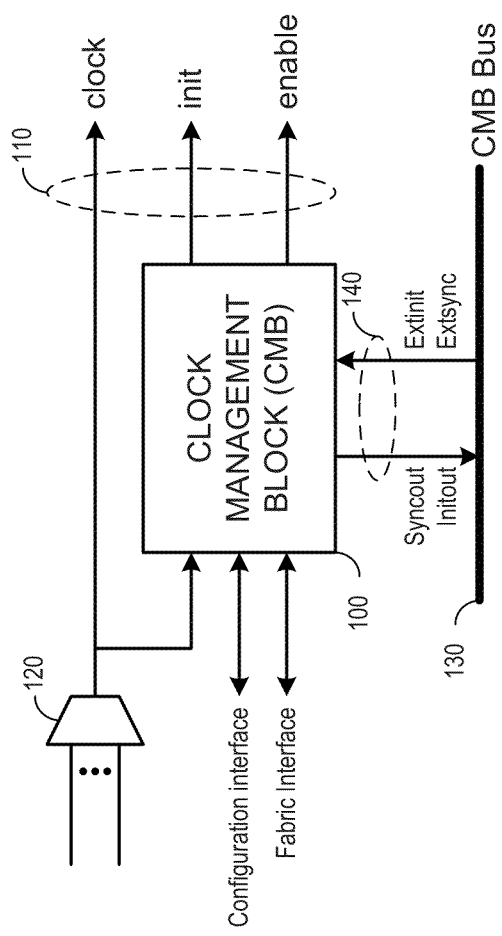
FIG. 1 conceptually illustrates a CMB with a clock tuple.

FIG. 1 conceptually illustrates a CMB 100 with a clock tuple 110 for some embodiments. As illustrated in FIG. 1, the clock tuple 110 includes an init signal and an enable signal. The clock tuple 110 also includes a clock signal, which is used to operate the CMB 100 and a clock domain. In some embodiments, the clock signal is a sub-cycle clock of a primary clock (or user clock), and the init and enable signals are synchronized to the sub-cycle clock. The sub-cycle clock is sourced by a clock selection multiplexer 120, which selects the sub-cycle clock as a local clock for a clock domain from among a number of clock sources. In some embodiments, these clock sources can include phase-locked loops (PLLs), crystal oscillators, clock divider logics, or other oscillatory signal sources. FIG. 1 also illustrates the CMB 100 to connect with a CMB bus 130 via communication signals 140.

To configure multiple clock domains to operate from the same clock source, some embodiments arrange CMBs associated with different clock domains into master-slave arrangements. An individual CMB such as the CMB 100 can be configured as a CMB master or a CMB slave. A master CMB communicates with its slave CMBs via the CMB bus. In some embodiments, the CMB bus communication signals 140 includes input signals 'Extinit' and 'Extsync' and output signals 'Syncout' and 'Initout'. When the CMB 100 is configured as a master, it uses 'Syncout' and 'Initout' output signals to communicate with its slave. When CMB 100 is configured as a slave, it uses 'Extinit' and 'Extsync' input signals to receive information from its master.

Figure 3:
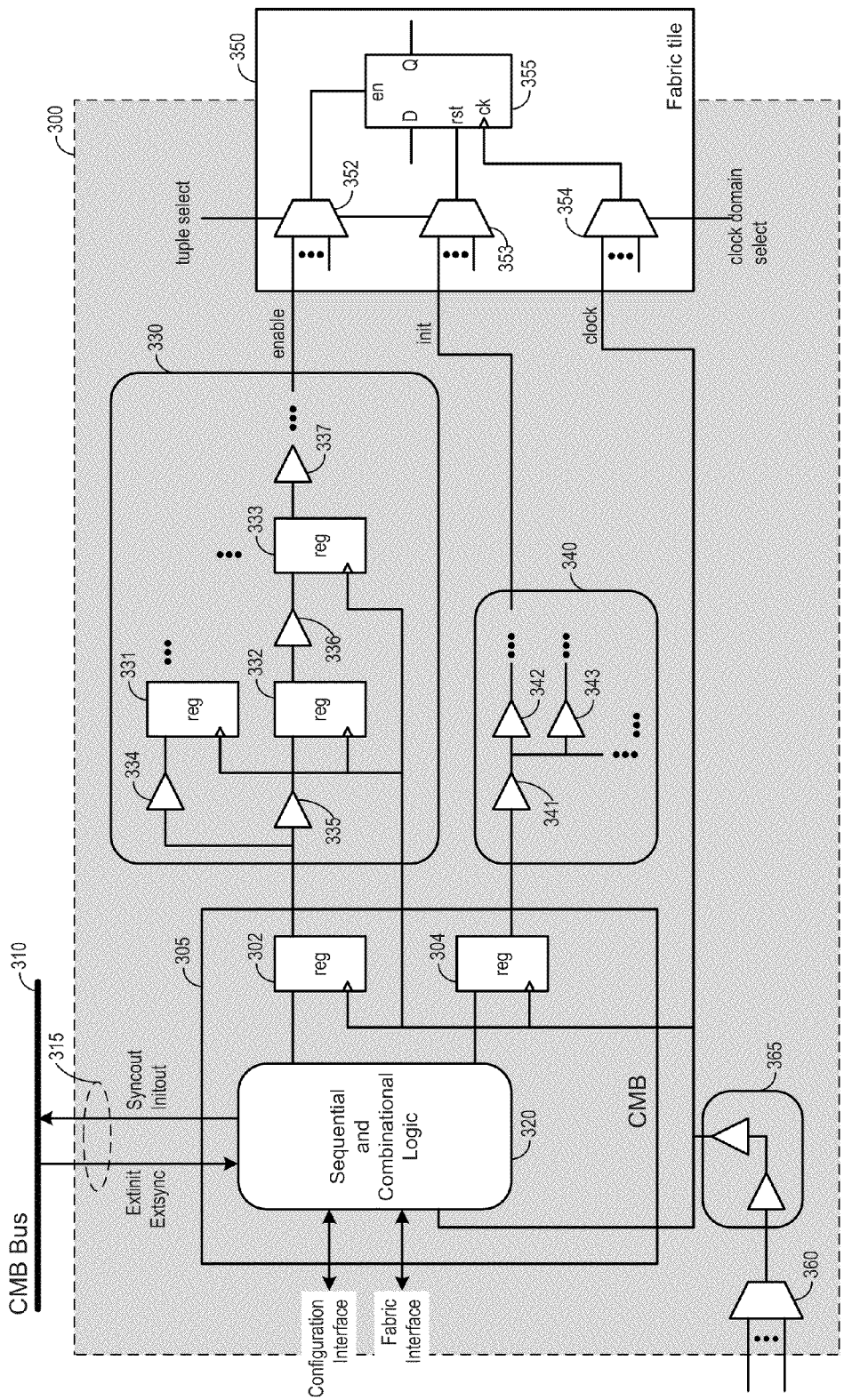
FIG. 3 illustrates synchronization and distribution of init and enable signals in an example clock domain.

Based on the CMB bus communication signals 140, the CMB 100 generates init and enable signals that are synchronized with the clock selected by the multiplexer 120. In some embodiments, the init signal is used to synchronously reset sequential storage element that operates in the selected clock, and the enable signal is used to synchronously enable (or conversely halt) sequential operations such as state machines or counters that operate in the selected clock. In some embodiments, the enable signal and the init signals are high fan-out signals that drive many sequential elements such as flip-flops, latches and memory structures. In some of these embodiments, the enable and init signals are sourced by the CMB 100 and reaches destination circuits via high fan-out distribution structures such as H-trees, buffer networks and register stages. FIG. 3 below will further describe the synchronization and distribution of enable and init signals.

In some other embodiments, the clock tuple includes a set of synchronized signals different from what is illustrated in FIG. 1. In some of these embodiments, the clock tuple does not include either init or enable signals. Some embodiments include in the tuple other high fan-out signals that need to be synchronized with a particular clock. For example, in some embodiments, the tuple includes a user defined control signal from a fabric of configurable circuits that is synchronized and distributed by the CMB.

For some embodiments in which the IC includes a fabric of configurable circuits, the CMB includes a fabric interface via which the CMB can communicate directly with the configurable circuits in the IC. In some of these embodiments, a user of the IC can program some or all of the configurable circuits to communicate with or to gain control of the CMB as part of the user defined operation of the configurable circuits. In some embodiments, the fabric interface includes a 'fabricinit' and 'fabenable' for controlling the init and enable signals of the CMB.

In some embodiments, the CMB also includes a configuration interface for accepting control signals and for providing status signals. The configuration interface is used to control and monitor the operations of the CMB. In some embodiments, such control and status monitoring can originate from a processor or a state machine in the IC, a different IC in a same system, or an external host computing device (e.g., a computer), or any other computing component or device. In some embodiments, the configuration interface is the CMB's interface to a configuration network (CN), and in some of these embodiments, the configuration network is controlled by a configuration controller. In some of these embodiments, the IC includes the configuration controller for processing configuration data and configuring configurable circuits in the IC through the configuration network. Examples of configuration controllers and configuration networks can be found in U.S. Pat. No. 7,375,550.

Figure 2:
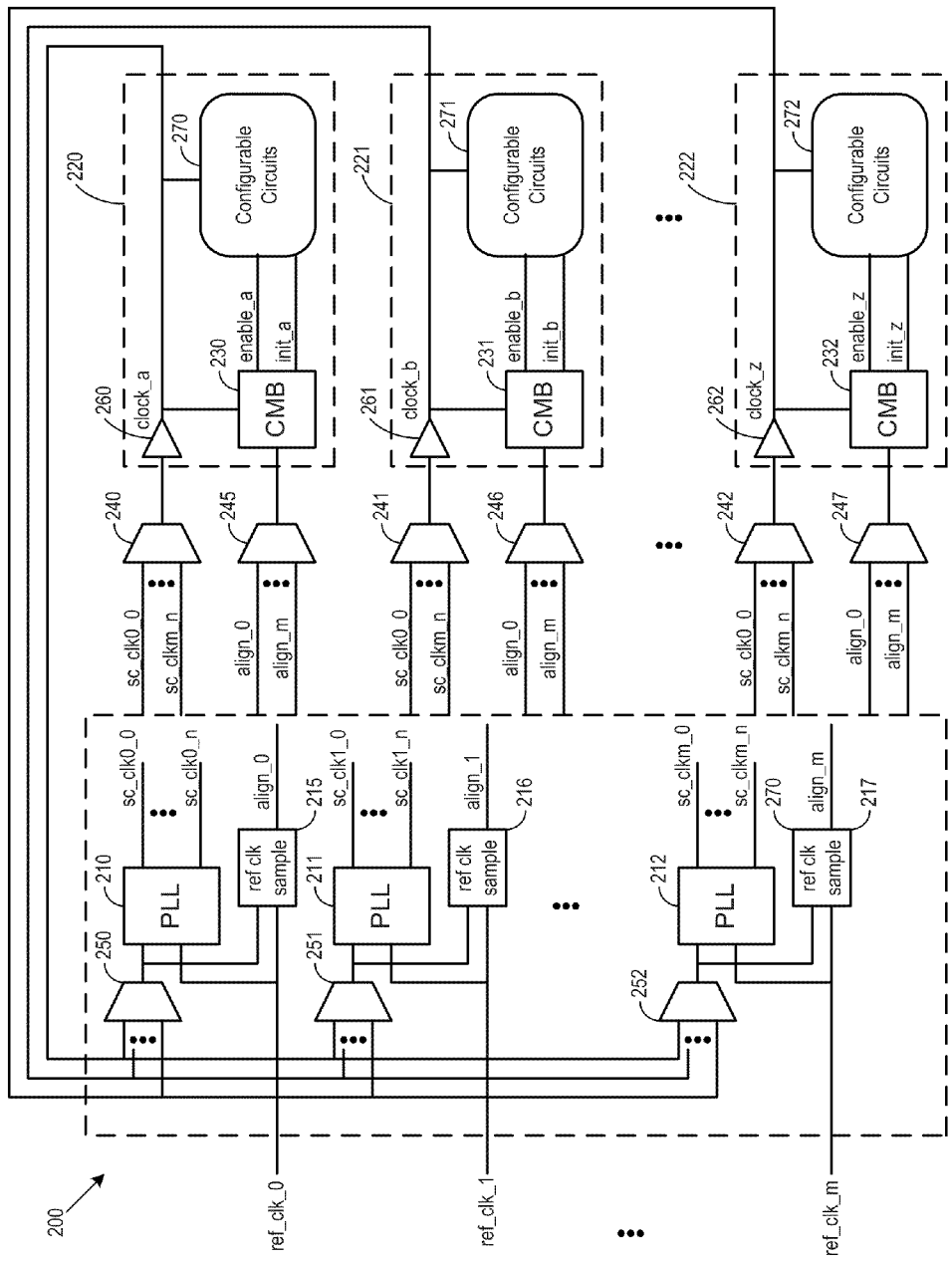
FIG. 2 illustrates an example of an integrated circuit that uses multiple CMBs to manage configurable clock distribution from multiple clock sources to multiple clock domains.

For some embodiments, FIG. 2 illustrates an example of an IC 200 that uses multiple CMBs to manage configurable clock distribution from multiple clock sources to multiple clock domains. As illustrated, the IC 200 includes PLLs 210-212 and clock domains 220-222. The CMBs 230-232 and configurable circuits 270-272 operate in clock domains 220-222. The clock domains 220-222 also include clock distribution networks 260-262. The integrated circuit 200 also includes sub-cycle clock multiplexers 240-242, clock alignment multiplexers 245-247, feedback clock multiplexer 250-252, and reference clock sampling modules 215-217.

Each of the PLLs 210-212 generates a number clocks based on a reference clock (ref_clk). In some embodiments, some or all of the reference clocks supplied to the PLLs are generated internally within the IC 200. The sources of the reference clocks are other modules or components in the IC 200. In some instances, the IC 200 is a system on chip (SoC) implementation that includes other modules or components such as processors, memories, communication interfaces (e.g., network PHY), or other types of circuit modules capable of providing an oscillatory signal. Examples of a SoC will be further described below by reference to FIG. 26. In some embodiments, a circuit module that provides a reference clock also transmits data to and/or receives data from some of the configurable circuits. Such signal traffics are synchronized with the provided reference clock in some embodiments.

In some other embodiments, some or all of the reference clocks are supplied by devices external to the IC 200. Such external devices can include a crystal oscillator, an integrated circuit (e.g., a processor, a FPGA, or an ASIC), or any other type of electronic circuit capable of generating an oscillatory signal to the IC. One such external device can supply one or more of the reference clocks to the IC 200 in some embodiments. Some embodiments include one or more of such reference clock generating devices together with the IC 200 in one electronic system. Examples of an electronic system that includes an IC similar to 200 and other electronic devices will be further described below by reference to FIG. 28. In some embodiments, an external device that supplies a reference clock to the IC 200 also transmits data to and/or receives data from the IC 200. Such communications are synchronized with the supplied reference clock in some embodiments.

In some embodiments, each PLL is programmed so that some or all of the generated clocks are sub-cycle clocks (sc_clk) of the reference clock (i.e., with period that is at an integer fraction of the reference clock). Reference clock sampling modules 215-217 generates alignment indications for PLLs 210-212 respectively. In some embodiments, the alignment indications are used by CMBs to determine which sub-cycle of a reference clock cycle is the first sub-cycle (sub-cycle 0) for each of the reference clocks of PLLs 210-212. The operation to determine which sub-cycle is the sub-cycle 0 will be further described by reference to FIGS. 12-14 below.

Each PLL also receives, as its feedback clock, a version of the sub-cycle clock that the PLL itself generated. In order for a PLL to lock on to a clock phase that accurately reflect the delay in a clock distribution network, some embodiments route the sub-cycle clock signal at the end of the clock distribution network as the feedback clocks to the PLL. In the example illustrated in FIG. 2, the outputs of clock distribution networks 260-262 conceptually represent the ends of those networks that are used to drive clock domains 220-222 respectively. These outputs of clock distribution networks are then fed back to the PLLs 210-212 via feedback multiplexers 250-252, which each select a feedback clock for the respective PLL from one of the clock domains.

In some embodiments, the clock domains 220-222 are defined by the clock distribution networks 260-262 respectively. For example, the clock domain 220 defined by the clock distribution network 260 includes circuits that receives and uses the clock that is distributed by the distribution network 260, which includes the CMB 230 and the configurable circuits 270. Clock distribution networks 240-242 receives its input from sub-cycle clock multiplexers 240-242. In some embodiments, this clock distribution structure is a combination of a recursive H-tree structure that at its lowest leaf level becomes fishbone tree structures. Other embodiments use other well known clock distribution architectures. In some embodiments, these clock distribution networks are physically designed into the IC prior to fabrication in order to minimize skew.

The configurable circuits 270-272 are configurable circuits in the IC that can be configured to operate in the clock domains 220-222. In some embodiments, configurable circuits such as 270-272 can be configured to operate in one of several clock domains. For some of these embodiments, configurable circuits 270-272 can represent the same set of physical circuits, the physical circuits being a set of configurable circuits that can be configured to operate in any of the clock domains 220-222. In some embodiments, a configurable circuit configured to operate in a particular clock domain is also configured to use the control signals (i.e., init and enable) generated by the CMB of that clock domain and synchronized to that clock domain. In some other embodiments, a configurable circuit can be configured to use the clock signal of one clock domain while using control signals from other clock domains.

Each of the sub-cycle clock multiplexers 240-242 selects a sub-cycle clock from the PLLs 210-212. In some embodiments, every clock output of every PLL is available to each of the clock domains via the sub-cycle clock multiplexers 240-242. In some embodiments, each clock multiplexer selects from only a sub-set of the PLLs or the PLL outputs in order to account for physical proximity in the chip between the PLLs and the clock domains.

The CMBs 230-232 provides enable and init signals that are synchronized to the clocks of the clock domains 220-222 respectively. Each of the CMBs 230-232 also receives an alignment indication signal from the reference clock sampling modules 215-217 via alignment multiplexers 245-247. In some embodiments, the CMBs 230-232 use the alignment indications to determine the sub-cycle 0 positions for the clock domains 220-222.

As mentioned above, a CMB in some embodiments generates and synchronizes the enable and init signals for each clock domain and distributes them to circuits operating in the clock domain through high fan-out distribution networks. For some of these embodiments, FIG. 3 illustrates the synchronization and distribution of the init and enable signals in an example clock domain 300.

As illustrated in FIG. 3, the clock domain 300 operates on a local clock that is selected by the multiplexer 360. The local clock is distributed within the clock domain 300 by a clock distribution network 365. The clock domain 300 includes a CMB 305, an enable signal distribution network 330, and an init signal distribution network 340. The clock domain 300 also includes the fabric tile 350 when the fabric tile is operating on the local clock sourced by the multiplexer 360 and distributed by clock distribution network 365.

As illustrated, the clock distribution network 365 is a physically predetermined structure that distributes the clock signal in a balanced manner so as to minimize clock skew between different recipients of the clock signal. In some of these embodiments, the clock distribution network 365 is a H-tree structure that is physically predetermined in the IC during the physical design process prior to manufacturing.

In some embodiments, the signal distribution networks 330 and 340 are also physically predetermined structures. As illustrated in FIG. 3, the signal distribution network 330 for the enable signal is interspersed with sequential elements (such as flip-flops) in order to ensure that the enable signal arrives at all of its destinations at the same clock cycle or at a predictable offset from each other. On the other hand, the signal distribution network 340 for the init signal has only signal buffers but no sequential elements. Some embodiments use this type of signal distribution network for the init signal because the init signal does not require precise timing and because a distribution network without sequential elements uses less power and chip area. In some other embodiments where precise timing is required for the init signal but not for the enable signal, the init signal has a physical distribution network similar to 330 while the enable signal has a physical distribution network similar to 340.

Figure 15:
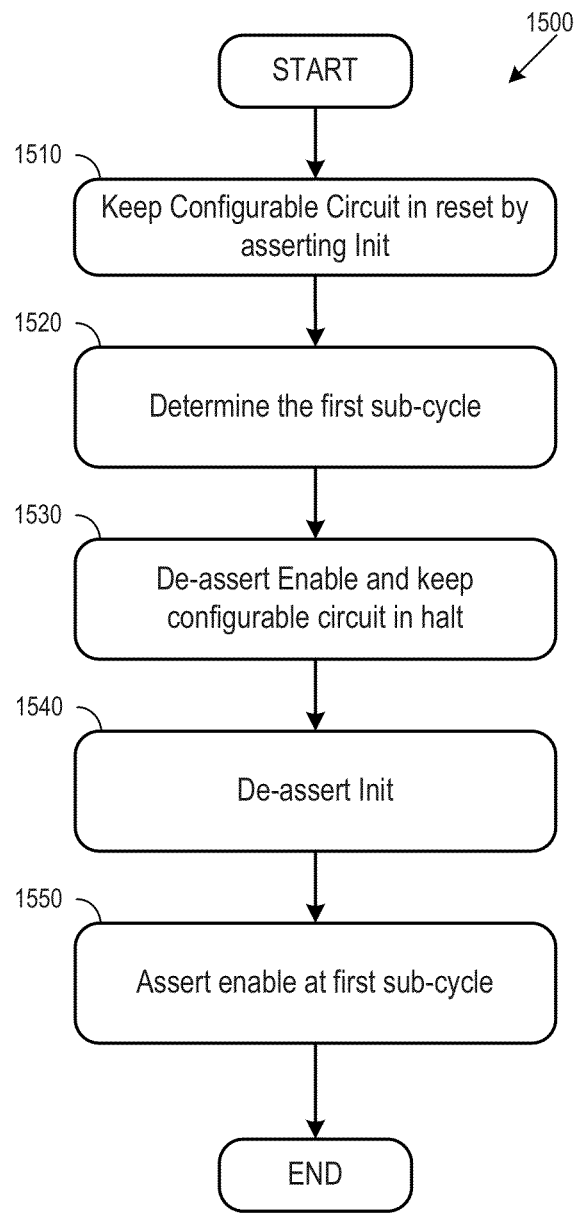
FIG. 15 conceptually illustrates a process for using a CMB to align a sub-cycle (reconfiguration) signal generator with a reference clock.

The CMB 305 includes a sequential and combination logic section 320 that communicate with a CMB bus 310 and generates the enable and init signals. The sequential and combination logic section 320 controls the communication with other CMBs via the CMB bus using CMB communication signals 315 (e.g., Extinit, Extsync, Syncout and Initout). In some embodiments, the section 320 includes a finite state machine that operates on the local clock. An example of such a finite state machine will be further described below by reference to FIGS. 15-17. In some of these embodiments, the sequential and combinational logic section 320 generates the enable and init signals based on its interaction with the CMB bus 310.

In some embodiments, the sequential and combinational logic section 320 also communicates with a configuration network and/or a fabric of configurable circuits via the CMB's configuration interface and fabric interface. In some of these embodiments, the CMB 305 enters or leaves one of its operational modes when the section 320 receives signals from the configuration interface and/or fabric interface. Some examples of the CMB operational modes are described below in Section V. In some embodiments, the section 320 determines the CMB's 'init' and 'enable' outputs as well as the CMB communication signals 315 partly according to the input it receives via the configuration interface and fabric interface.

As illustrated in FIG. 3, the enable and init signals are synchronized by registers 302 and 304, which operate in the clock domain 300. In some of these embodiments, the init and enable signals are sourced by combinational elements in the section 320 rather than registers such as 302 and 304. In these instances, the init and enable signals are synchronized to the clock domain via sequential elements in the section 320.

The enable signal distribution network 330 distributes the enable signal from the CMB to one or more destination nodes in the integrated circuit. The network 330 includes pipeline registers such as 331-333 and signal buffers such as 334-337. From a single node in the CMB 305 (e.g., synchronization register 302), the pipeline registers and the signal buffers in the distribution network 330 fan-out the enable signal to reach one or more destination nodes in the IC. Some embodiments ensure that the enable signal arrives at the all of its destination circuits at the same clock cycle by ensuring that each destination node receives the enable signal after the same number of pipeline delays from the source node in the CMB 305. Instead of using pipeline registers, some other embodiments use balanced signal distribution structures such as H-trees to ensure that the enable signal arrives at the destination nodes with minimal timing skew between different destination nodes.

The init signal distribution network 340 distributes the init signal from the CMB to one or more destination nodes in the IC. The network 340 includes signal buffers such as 341-343. From a single node in the CMB 305 (e.g., synchronization register 304), the signal buffers in the distribution network 340 fan-out the init signal to reach one or more destination nodes in the IC. Some embodiments use balanced signal distribution structures such as H-trees to ensure that the init signal arrives at the destination nodes with minimal timing skew between destination nodes. In some other embodiments, the init signal distribution network does not employ balanced distribution structures. In some of these embodiments, the CMB 305 uses the enable signal to freeze or halt operations at destination nodes prior to toggling the init signal, and thus the IC would properly function as long as all of the destination nodes receive valid init signal prior to the CMB using the enable signal to resume operations.

In some embodiments, a fabric tile such as the tile 350 is a unit of configurable circuits in the IC. The fabric tile 350 is one of many fabric tiles that form the fabric of configurable circuits in the IC. In some embodiments, the user operations performed by the configurable circuits in the fabric can communicate directly with CMBs such as the CMB 300 via its fabric interface. In some embodiments, the configurable circuits in the fabric tile 350 include real-time reconfigurable logic circuits and reconfigurable interconnect circuits. Fabric tiles that include real-time reconfigurable circuits will be further described below by reference to FIGS. 7-11.

As illustrated in FIG. 3, the fabric tile 350 includes a multiplexer 352 for selecting the enable signal, a multiplexer 353 for selecting the init signal, and a multiplexer 354 for selecting a clock. The fabric tile also includes sequential and combinational circuit elements such as the register 355. Unlike other circuit elements illustrated in FIG. 3, the fabric tile 350 is not always in the clock domain 300. The fabric tile 350 joins the clock domain 300 only when the multiplexer 354 selects the clock signals from the clock domain 300.

The register 355 operates on the clock signal at its 'ck' port, and it has an 'en' port for connecting to the enable signal and a 'rst' port for connecting to the init signal. The register 355 propagates signal from its 'D' input to its 'Q' output on the rising edge of the clock when the enable signal is asserted at the 'en' port. Conversely, when the enable signal is de-asserted at the 'en' port, the register 355 halts and holds the value at the 'Q' port rather than updating to a new value from 'D' port at a clock edge. In some other embodiments, the register 355 does not have 'en' port. In some of these embodiments, the enable signal is used to select the value at the 'D' input port such when the enable signal is de-asserted, the D input is selected to be the same as Q output (thus having the same effect as halt). The register 355 resets to a predefined value when the init signal is asserted at the 'rst' port. In some embodiments, asserting the init signal asynchronously resets the register 355 regardless of the signals at 'ck' and 'en' port.

As illustrated in FIG. 3, the selection signal for multiplexers 352 and 353 is a tuple select signal, while the selection signal for the multiplexer 354 is a clock domain select signal. The selection signals in some embodiments are configuration and control register bits. In some embodiments, these two selection signal are the same such that the clock, enable and init signals come from the same clock domain and from the same clock tuple. In some other embodiments, the tuple select signal and clock domain select signals are decoupled such that a user may configure the enable and init signals to come from a different clock domain than the clock signal. In some other embodiments, the enable signal and the init signal do not share the same domain select signal, but rather each has its own select signal so the enable signal and the init signal can each be controlled by its own CMB.

Figure 4:
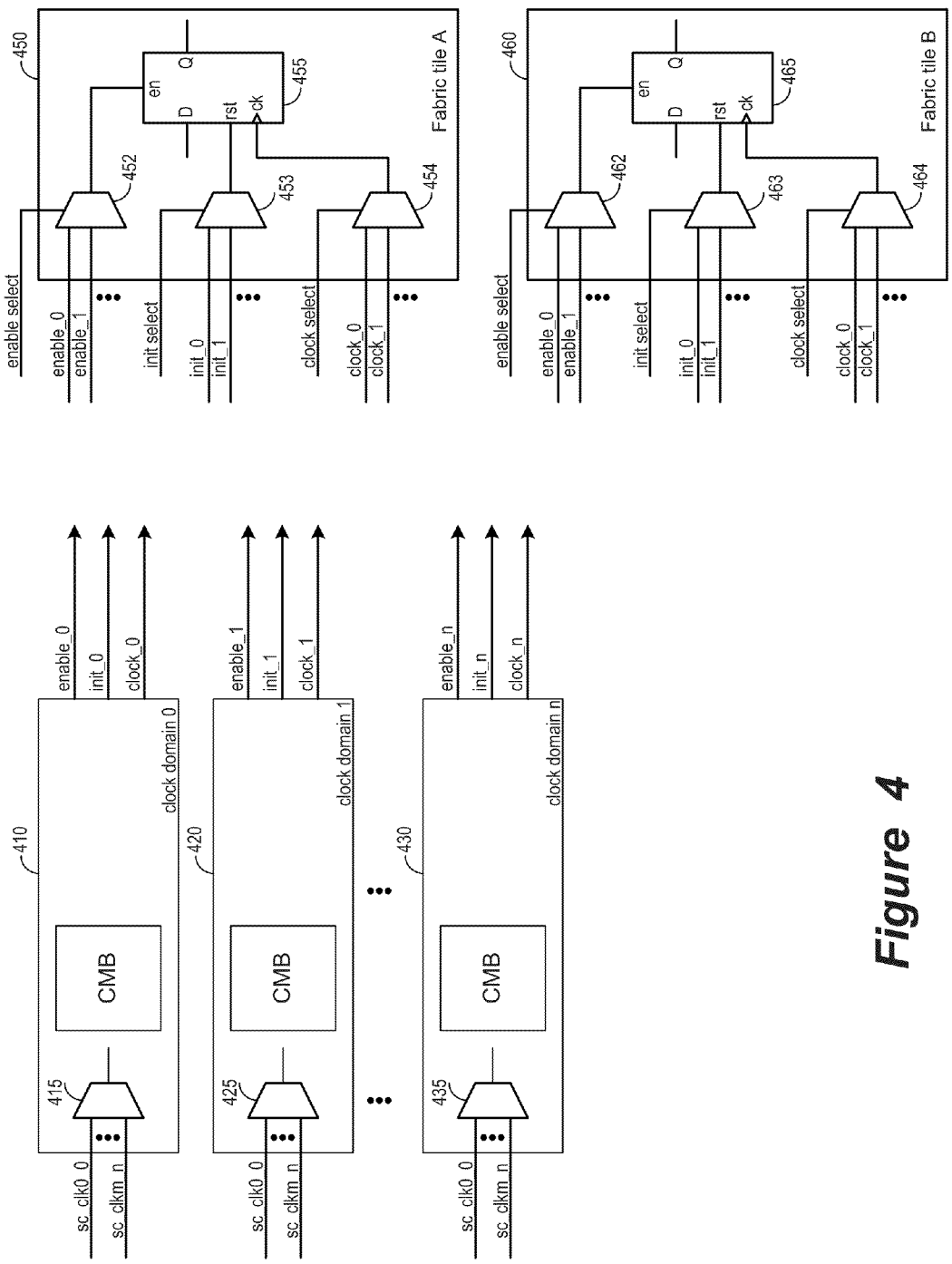
FIG. 4 illustrates selection of clock, enable and init signals from several possible clock domains by fabric tiles.

For some embodiments, FIG. 4 illustrates the selection of clock, enable and init signals from several possible clock domains by fabric tiles. As illustrated, FIG. 4 includes fabric tiles 450 and 460 and multiple clock domains 410, 420 and 430. Like the fabric tile 350 of FIG. 3, the fabric tile 450 includes a multiplexer 452 for selecting the enable signal, a multiplexer 453 for selecting the init signal, and a multiplexer 454 for selecting a clock. The fabric tile 450 also includes sequential and combinational circuit elements such as the register 455. The fabric tile 460 likewise includes multiplexers 462, 463 and 464 for selecting enable, init and clock signals as well as sequential and combinational circuit elements such as the register 465.

As illustrated in FIG. 4, the fabric tiles 450 and 460 have separate select signals for enable, init and clock signals. However, as mentioned above by reference to FIG. 3, some embodiments use one single control signal to control all three select signals, while some other embodiments use a tuple select signal to control the multiplexers 452 and 453 and a clock domain select signal to control the multiplexer 454.

Each of the clock domains 410, 420 and 430 is similar to the clock domain 300 of FIG. 3. Each clock domain includes a CMB and a local clock multiplexer (multiplexer 415 for clock domain 410, multiplexer 425 for clock domain 420 and multiplexer 435 for clock domain 430) for selecting a clock source as the local clock for the clock domain. Each clock domain supplies a set of enable, init and clock signals to the fabric tiles 450 and 460. The multiplexers 452, 453 and 454 select the enable, init and clock signals from the clock domains 410-430 for the fabric tile 450 and the multiplexers 462, 463 and 464 likewise select the enable, init and clock signals from the clock domains 410-430 for the fabric tile 460.

For embodiments that have separate select signals for init, enable and clock, each of the init, enable, and clock can come from a different clock domain or a CMB. Some embodiments use the separate select signals in order to minimize clock skew between fabric tiles controlled by different CMBs. For example, the CMB in clock domain 410 can be configured to control the init/enable of the fabric tile 450 while the CMB in clock domain 420 can be configured to control the init/enable of the fabric tile 460. To minimize skew between the fabric tile 450 and 460, these two fabric tiles can be configured to operate in the same clock domain by having their clock select multiplexers (454 and 464) select the same clock from the same clock domain.

II. CMB Bus

In some embodiments, different clock domains can be configured to use the same clock source (i.e., the same PLL or the same PLL output, further described in FIG. 6 below). To configure different clock domains to operate from the same clock source, some embodiments arrange CMBs associated with different clock domains into master-slave arrangements. A CMB may be configured as either a Master CMB or a Slave CMB. Some embodiments allow one master to have multiple slaves. In some embodiments, a slave CMB mirrors or mimics the state of its master such that the slave's clock tuple has a fixed timing relationship with respect to the master's clock tuple. In some embodiments, the master and slave CMBs communicate with each other via a CMB bus.

Figure 5:
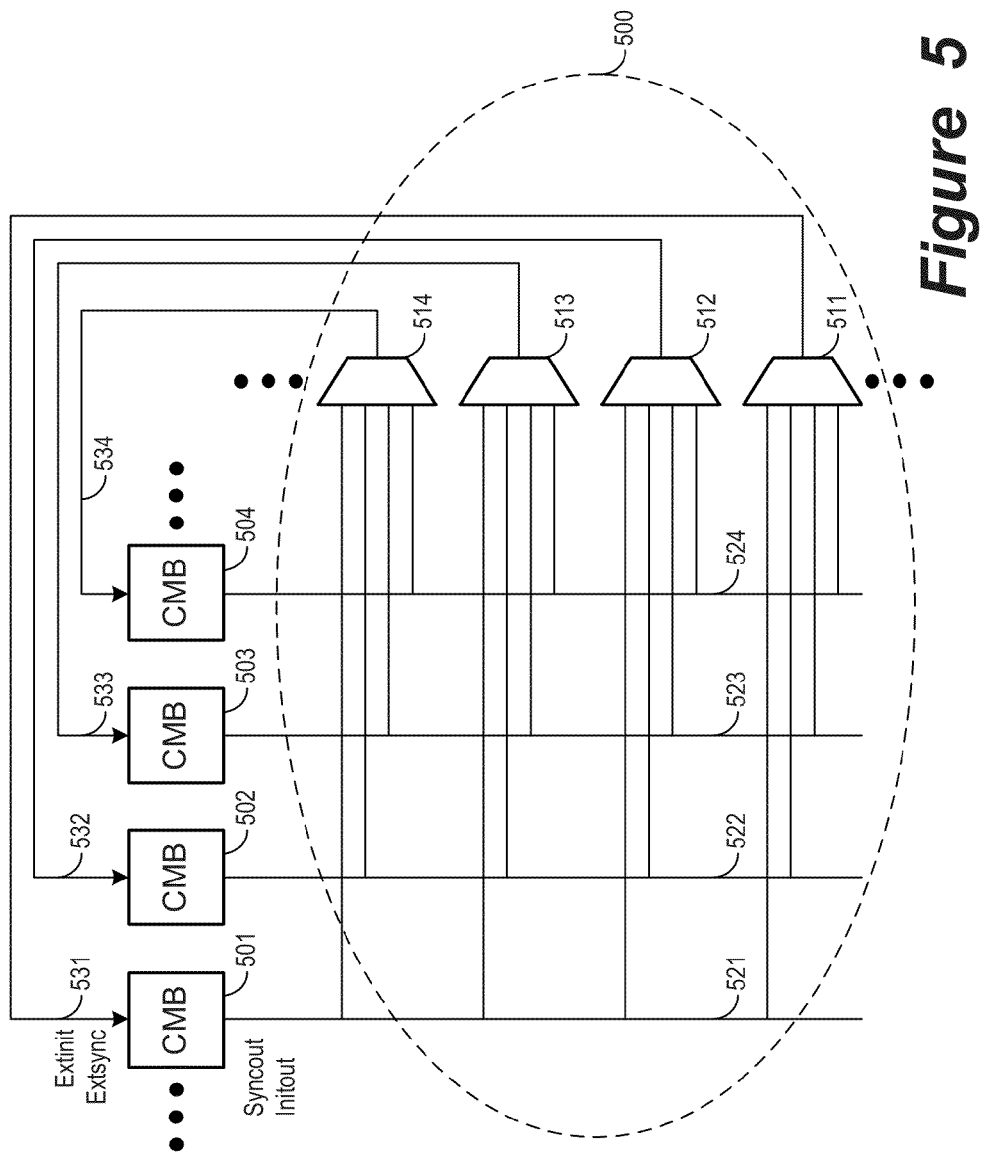
FIG. 5 illustrates an example of a CMB bus.

For some embodiments, FIG. 5 illustrates an example of a CMB bus 500. The CMB bus 500 allows the CMBs 501-504 to communicate with each other. The CMB bus 500 also includes CMB output paths 521-524, CMB input paths 531-534, and input multiplexers 511-514. For some embodiments, each CMB output path includes 'Syncout' and 'Initout' signals from a CMB, and each CMB input path includes 'Extsync' and 'Extinit' signals to a CMB. A CMB is configured as a particular CMB's slave when its corresponding input multiplexer is set to select input signals from that particular CMB. For example, if CMB 501 is configured as the master of the CMBs 503 and CMB 502 is configured as the master of the CMB 504, the multiplexer 513 would be configured to select input from the CMB 501 and the multiplexers 514 would be configured to select input from CMB 502. One of ordinary skill would recognize that many other conventional bus structures or topologies are possible for implementing the CMB bus for different embodiments of the invention. For example, the multiplexers 511-514 can be replaced with tri-state buses.

Figure 6:
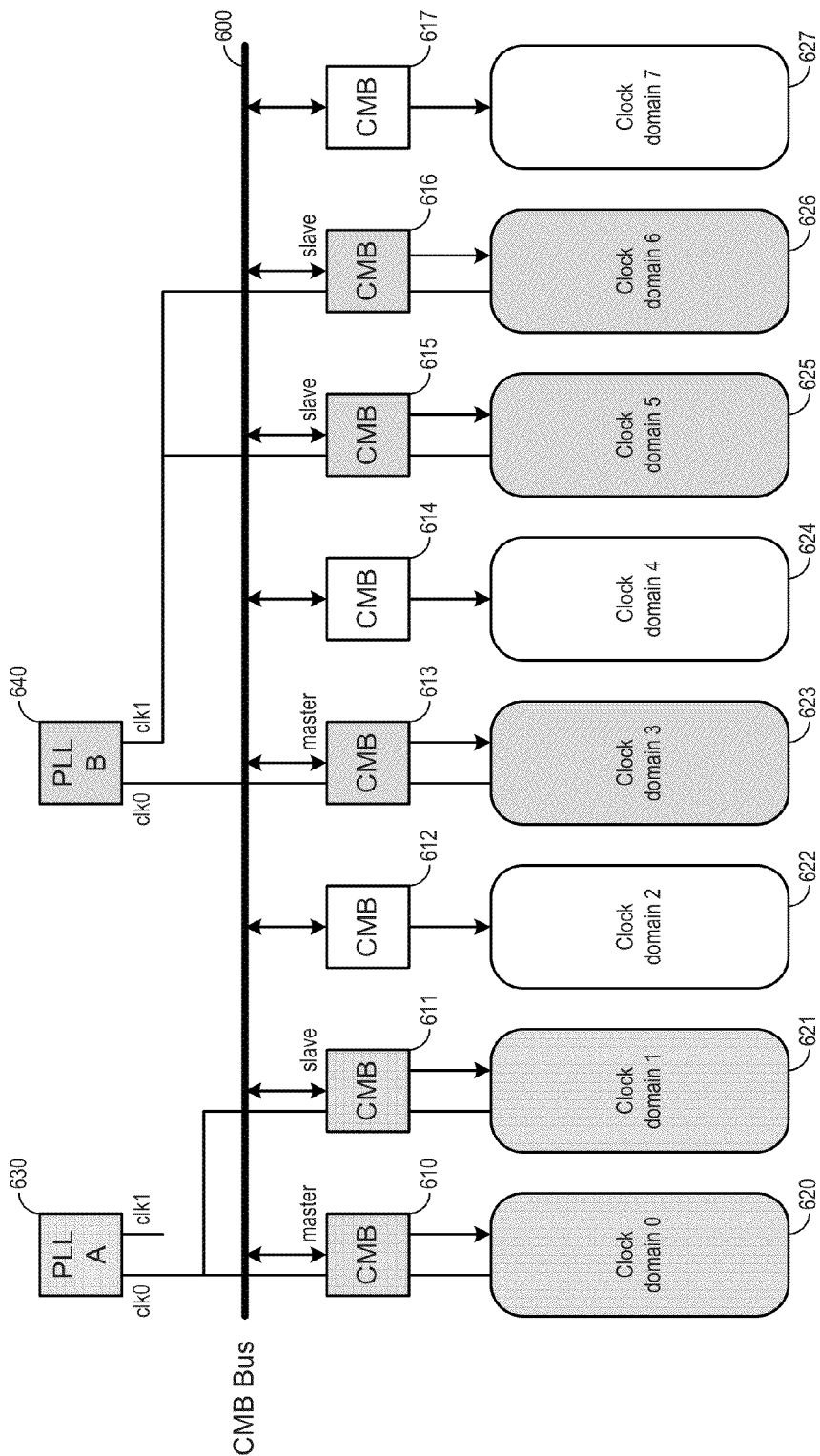
FIG. 6 conceptually illustrates an example of CMBs in master-slave arrangements.

FIG. 6 conceptually illustrates an example of CMBs in master-slave arrangements. As illustrated in the figure, CMBs 610-617 are communicatively coupled with each other via the CMB bus 600. The CMBs 610-617 are also associated with clock domains 620-627. FIG. 6 also illustrates PLLs 630 and 640 that serve as clock sources for the CMBs and the clock domains.

As illustrated, CMBs 610 and 611 are in one master-slave arrangement while CMBs 613, 615 and 616 are in another master-slave arrangement. The CMB 610 is the master of the CMB 611 while the CMB 613 is the master of both the CMBs 615 and 616. The clock domains 620 and 621 are in one master-slave arrangement (CMBs 610 and 620) and configured to operate in the same clock from the same clock source (PLL 630). The clock domains 623, 625 and 626 are in another master-slave arrangement (CMBs 613, 615 and 616) and configured to operate using the same clock from the same clock source (PLL 640).

In some embodiments, clock domains and CMBs that are in the same master-slave arrangement may share the same output of the same PLL. For instance, the clock domains 620 and 621 are both using the same output 'clk0' of the PLL 630. In some embodiments, clock domains and CMBs that are in the same master-slave arrangement may use different outputs of the same PLL as the clock source. For instance, clock domains 625 and 626 are both using the output 'clk1' of the PLL 640 while clock domain 623 is using a different output 'clk0' of the PLL 640.

If configured as a master, a CMB in some embodiments will broadcast its command on the CMB bus using 'initout' and 'syncout', and an appropriately configured slave can then use the master's command to mirror its clock tuple with that of the master. For some embodiments, Table 1 below provides a list of example CMB bus commands that can be broadcasted by a master CMB. The table also illustrates a slave CMB's 'init' and 'enable' signal outputs upon the slave's receiving these commands via the CMB Bus.

TABLE 1

| CMB bus command | Master initout | Master syncout | SLAVE Init | SLAVE Enable |
|---|---|---|---|---|
| Reset slave's clock domain | 1 | 0 | 1 | 0 |
| Master synchronization | 1 | 1 | 1 | 0 |
| Halt the slave's clock domain | 0 | 0 | 0 | 0 |
| Normal operation | 0 | 1 | 0 | 1 |

In the example list of CMB bus commands as illustrated in Table 1, the slave CMB uses the 'init' signal to reset the sequential elements operating in its clock domain when it receives a "Reset slave's clock domain command". The slave CMB uses the 'init' signal to keep its clock domain in the reset state when it receives a "Master synchronization" command, which in some embodiments indicates that the master CMB is performing an alignment operation with respect to a reference clock. The slave CMB de-asserts 'init' while keeping 'enable' signal de-asserted when it receives the 'Halt the slave's clock domain' command, which causes the sequential elements operating in the slave CMB's clock domain to halt (e.g., not to advance the count in the counters) without being reset. Upon receiving 'Normal operation' command, the slave CMB asserts the 'enable' signal while keeping 'init' de-asserted so the slave CMB can proceed to allow normal operations to take place in its clock domain.

III. CMB and Reconfigurable Circuits

In some embodiments, each CMB-controlled clock domain provides a clock to one or more configurable circuits that form the IC's configurable circuit fabric. The configurable circuits can be configured to perform different functions according to different sets of configuration data. Each configurable circuit can be configured to operate in one of several clock domains. For some embodiments, the configurable circuits in the fabric are organized into tiles, where each tile can be configured to operate in one of several clock domains as discussed earlier by reference to FIG. 4.

Figure 7:
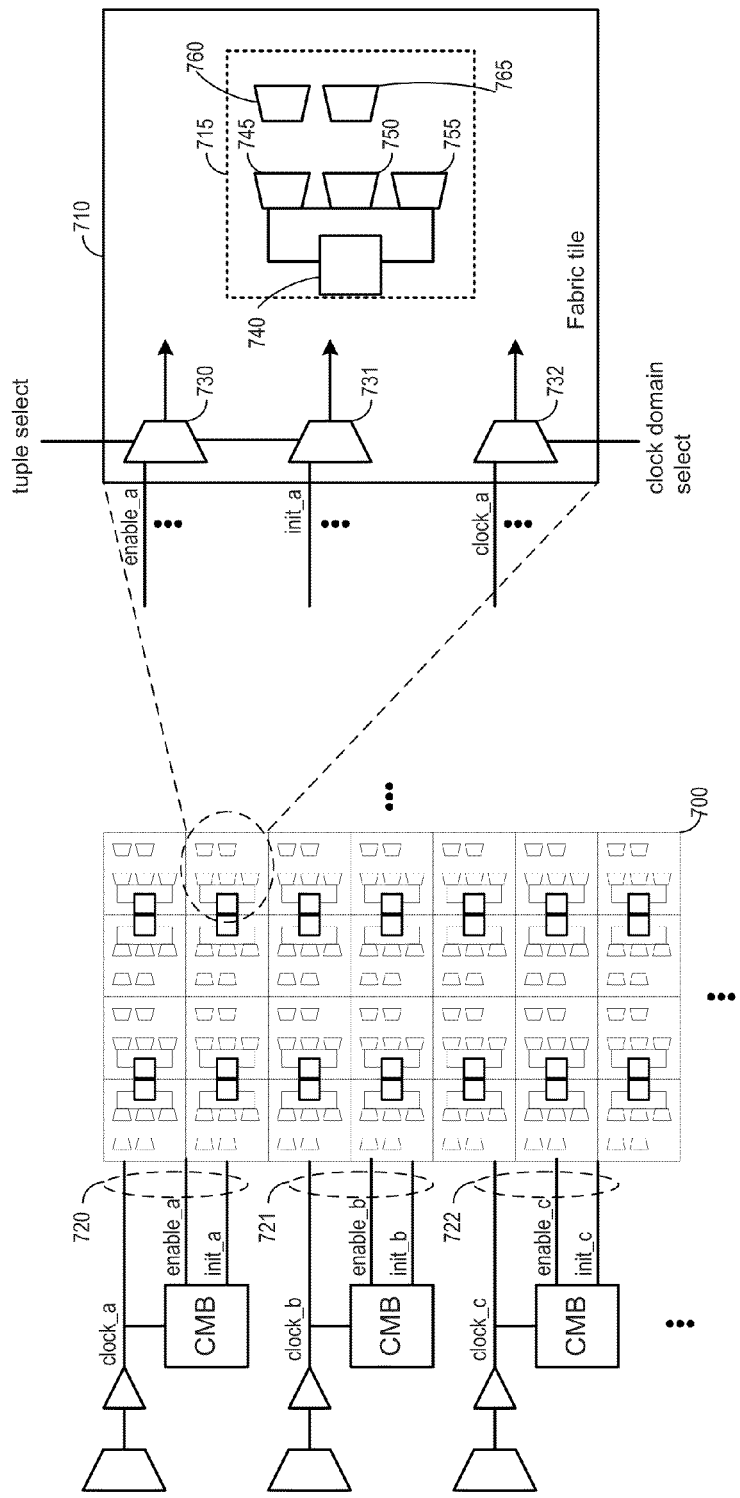
FIG. 7 illustrates a fabric of configurable circuits.

FIG. 7 illustrates a fabric 700 of configurable circuits. The fabric 700 includes a two-dimensional array of fabric tiles such as tile 710. Each fabric tile includes a set of configurable logic circuit such as 715. In some embodiments, the configurable circuit 715 includes configurable logic circuits and configurable interconnect circuits. In the illustrated example, the configurable logic circuits and configurable interconnect circuits include a three-input LUT 740, three input-select multiplexers 745, 750 and 755, and two routing multiplexers 760 and 765. Configurable tiles in some embodiments can include other types of circuits, such as memory arrays.

Each fabric tile such as tile 710 also includes multiplexers 730-732 for selecting enable, init and clock signals from one of the several clock domains 720-722. As illustrated in FIG. 7, the selection signal for multiplexers 730 and 731 is a tuple select signal, while the selection signal for the multiplexer 732 is a clock domain select signal. In some embodiments, these two selection signals (i.e., the tuple select signal and the clock domain select signal) are the same. In some other embodiments, the tuple select signal and the clock domain select signal are decoupled such that a user may configure the enable and init signals to come from a different clock domain than the clock signal. In some other embodiments (not illustrated here), the enable and init do not share a same tuple select signal, but rather each has its own select signal so that the enable and the init can each come from its own clock domain or be controlled by its own CMB. In some embodiments, the CMBs themselves can be controlled by the configurable circuits in the fabric via the CMBs' fabric interface during user-defined operations as described above in FIGS. 1 and 3.

In some embodiments, the clock distribution scheme that utilizes the CMBs described above can be used in conjunction with configurable logic circuits that are real-time reconfigurable on a sub-cycle basis (sub-cycles of reconfigurable circuits may be alternatively referred to as "reconfiguration cycles"). In some of these embodiments, the three-input LUT 740, the input-select multiplexers 745, 750 and 755 and the routing multiplexers 760 and 765 are all real-time, sub-cycle reconfigurable circuits. In some of these embodiments, the configurable IC stores multiple sets of configuration data for a sub-cycle reconfigurable circuit, so that the reconfigurable circuit can use different sets of configuration data in different sub-cycles.

Reconfigurable IC's are one type of configurable IC's. A reconfigurable IC is a configurable IC that includes configurable circuits that can be reconfigured during runtime. A reconfigurable IC typically includes reconfigurable logic circuits and/or reconfigurable interconnect circuits. A configurable logic or interconnect circuit is said to reconfigure when it receives a different set of configuration data for the configurable logic or interconnect circuit to perform a different user defined function in a new clock cycle.

Figure 8:
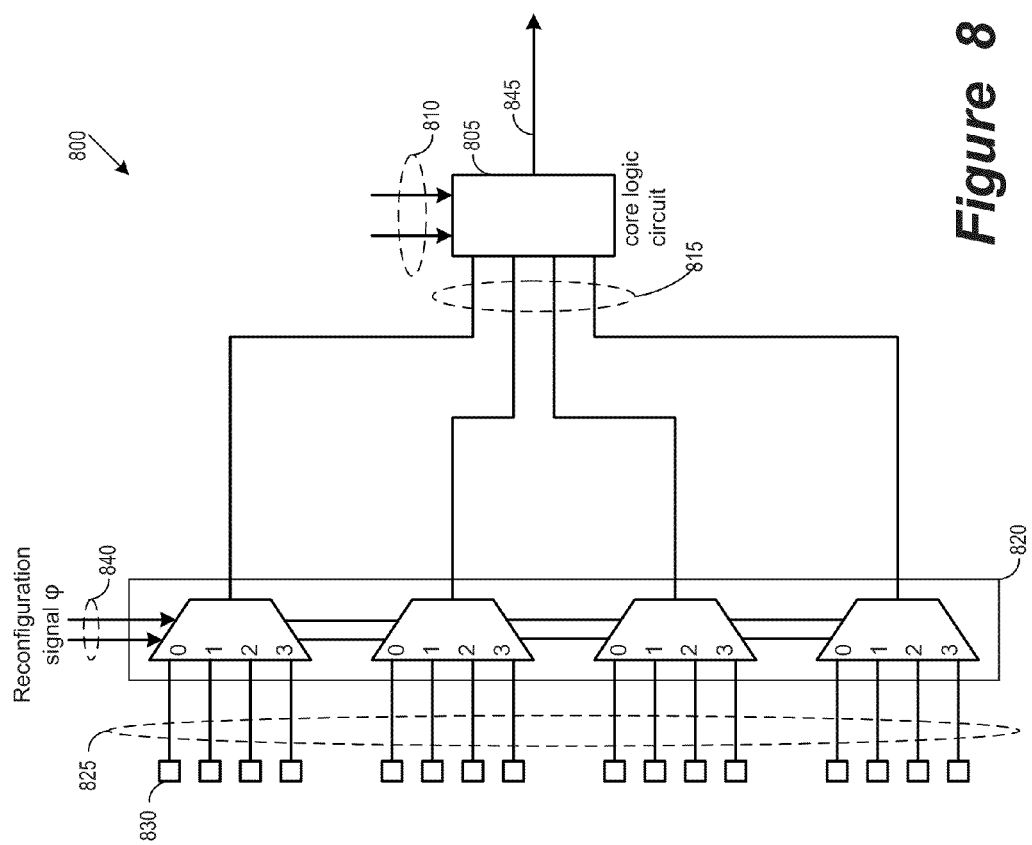
FIG. 8 illustrates an example of a reconfigurable logic circuit.

FIG. 8 illustrates an example of a reconfigurable logic circuit 800. This logic circuit includes a core logic circuit 805 that can perform a variety of functions based on a set of input data 810 that it receives. The core logic circuit 805 also receives a set of four configuration data bits 815 through a switching circuit 820. The switching circuit receives a larger set of sixteen configuration data bits 825 that are stored in a set of storage elements 830 (e.g., a set of memory cells, such as SRAM cells). This switching circuit is controlled by a two-bit reconfiguration signal ϕ through two select lines 840. Whenever the reconfiguration signal changes, the switching circuit supplies a different set of configuration data bits to the core logic circuit 805. The configuration data bits then determine the function that the logic circuit 805 performs on its input data. The core logic circuit 805 then outputs the result of this function on the output terminal set 845.

Any number of known logic circuits (also called logic blocks) can be used in conjunction with the invention. Examples of such known logic circuits include look-up tables (LUT's), universal logic modules (ULM's), sub-ULM's, multiplexers, and PAL's/PLA's. In addition, logic circuits can be complex logic circuits formed by multiple logic and interconnect circuits. Examples of simple and complex logic circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable logic circuits are provided in U.S. Pat. No. 7,157,933, entitled "Configurable Circuits, IC's, and Systems." This document is incorporated in the present application by reference.

Figure 9:
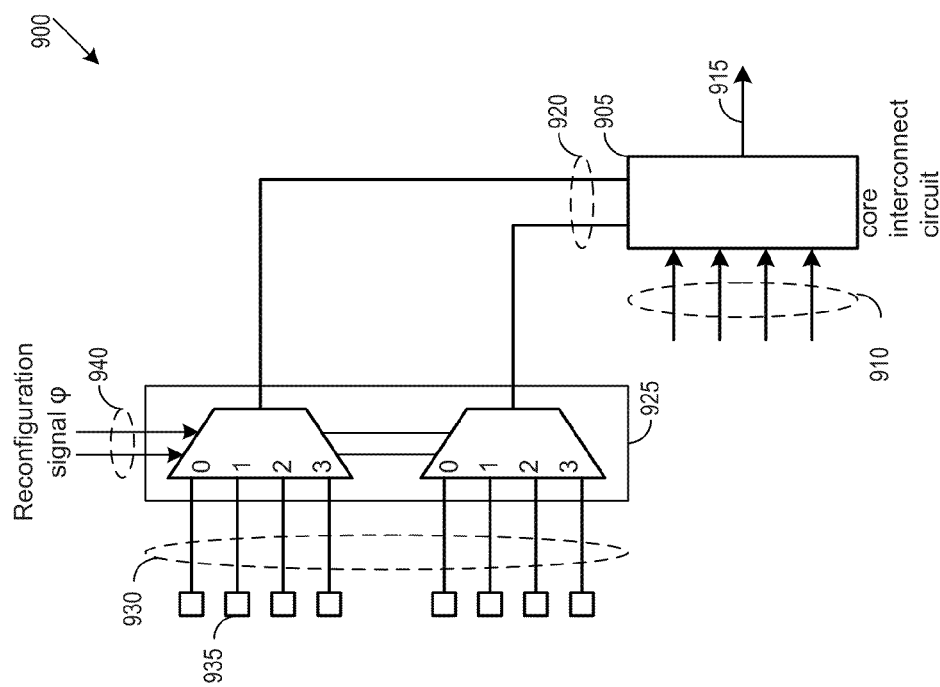
FIG. 9 illustrates an example of a reconfigurable interconnect circuit.

FIG. 9 illustrates an example of a reconfigurable interconnect circuit 900. This interconnect circuit includes a core interconnect circuit 905 that connects an input data terminals 910 to an output data terminal set 915 based on a configuration data set 920 that it receives from a switching circuit 925. The switching circuit 925 receives a larger set of configuration data bits 930 that are stored in a set of storage elements 935 (e.g., a set of memory cells, such as SRAM cells). This switching circuit is controlled by a two-bit reconfiguration signal ϕ through two select lines 940. Whenever the reconfiguration signal changes, the switching circuit supplies a different set of configuration data bits to the core interconnect circuit 905. The configuration data bits then determine the connection scheme that the interconnect circuit 905 uses to connect the input and output terminals 910 and 915.

Any number of known interconnect circuits (also called interconnects or programmable interconnects) can be used in conjunction with the invention. Examples of such interconnect circuits include switch boxes, connection boxes, switching or routing matrices, full- or partial-cross bars, etc. Such interconnects can be implemented using a variety of known techniques and structures. Examples of interconnect circuits can be found Architecture and CAD for Deep-Submicron FPGAs, Betz, et al., ISBN 0792384601, 1999, and Design of Interconnection Networks for Programmable Logic, Lemieux, et al., ISBN 1-4020-7700-9, 2003. Other examples of reconfigurable interconnect circuits are provided in the U.S. Pat. No. 7,157,933.

As mentioned above, the logic and interconnect circuits 800 and 900 each receive a reconfiguration signal ϕ. In some embodiments, this signal is a sub-cycle signal that allows the circuits 800 and 900 to reconfigure on a sub-cycle basis, i.e., to reconfigure one or more times within a cycle of a primary clock. The primary clock might be a design clock for which the user specifies a design (hence also called a user clock). For instance, when the design is a Register Transfer Level (RTL) design, the design clock rate can be the clock rate for which the user specifies his or her design in a hardware definition language (HDL), such as VHDL or Verilog. Alternatively, the primary clock might be an interface clock that defines the rate of input to and/or output from the IC (e.g., the rate that the fastest interface circuit of the IC passes signals to and/or receives signals from circuits outside of the IC). In some embodiments, the primary clock is based on a reference clock input to a PLL that sources the sub-cycle clock as described above by reference to FIG. 2.

Figure 10:
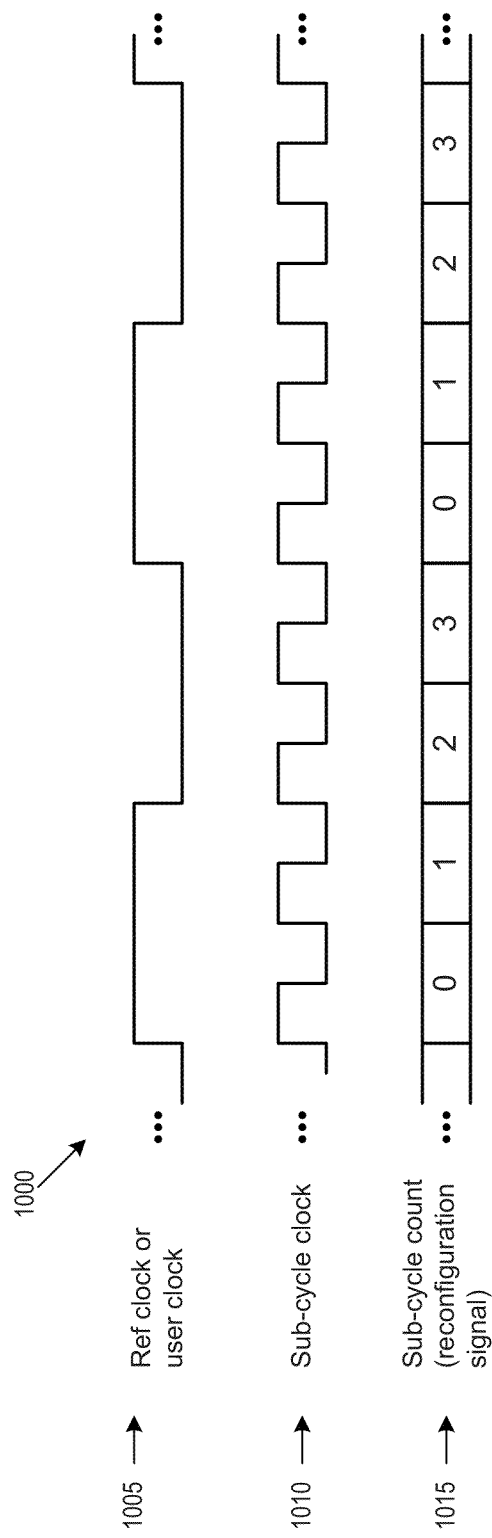
FIG. 10 illustrates an example timing diagram of a primary clock signal and a sub-cycle clock signal.

In some embodiments, a primary clock's cycle is divided into several sub-cycles. FIG. 10 illustrates an example timing diagram 1000 of a primary clock signal 1005 and a sub-cycle clock signal 1010. As shown in this figure, the primary clock's cycle is broken into four sub-cycles of equal duration. In some of these embodiments, a sub-cycle that falls within a particular section of the primary clock cycle is referred to as a "phase." For the examples illustrated in FIGS. 8-10, each of the four phases corresponds to a count in a sub-cycle counter or reconfiguration signal generator.

Even though FIG. 10 shows the phases as changing sequentially, these phases change in a non-sequential manner in some embodiments. Also, in some embodiments, the order of the phases in each period of the received clock can differ, e.g., in one clock period the phase bits might appear as 00, 10, 11, 01, and in the next clock period the phase bits might appear as 11, 10, 01, and 00. Moreover, in some or all primary cycles, not all possible phase bit permutations might be used or one or more phase bit permutations might be used more than once. Furthermore, different encoding schemes (e.g., a Gray code encoding scheme, a one-hot encoding scheme, etc.) might be used to generate the phase bits.

A primary cycle might be divided into more or fewer than four sub-cycles. Also, the rising and/or falling edges of a primary clock might not coincide with the rising and/or falling edges of the sub-cycle signal or signals. Moreover, the primary clock cycle might not correspond to an integer number of sub-cycles. For instance, in some embodiments, the sub-cycle signals have rates that share a common non-even multiple with the rate of the primary clock.

For some embodiments, the switching circuits 820 and 925 and the phase signal φ of FIGS. 8-10 present one way of providing configuration data to configurable logic or interconnect circuits on a sub-cycle basis. Other embodiments, however, use alternative switching circuitry and clock distribution schemes for providing configuration data to configurable logic or interconnect circuits at certain desired rates. For example, in some embodiments, the switching circuit 820 in FIG. 8 and 925 in FIG. 9 are context switchers that switchably connect the configurable circuits to different sets of configuration data. Examples of context switchers are provided in U.S. patent application Ser. No. 12/206,718, now issued as U.S. Pat. No. 7,928,761, entitled "Configuration Context Switcher With a Latch," filed on Sep. 8, 2008. This Application is incorporated in the present application by reference. In some embodiments, the storage element 830 of FIG. 8 and 935 of FIG. 9 includes "Q nodes", which are nodes in a storage structure that directly connects storage element with the context switcher. Reconfigurable circuits can obtain configuration data from these "Q nodes" without going through an access port shared by multiple storage elements in the storage structure. Examples of Q-nodes are also provided in U.S. patent application Ser. No. 12/206,718, now issued as U.S. Pat. No. 7,928,761.

Several embodiments were described above by reference to examples of sub-cycle reconfigurable circuits that operate based on four different sets of configuration data. In some of these examples, a reconfigurable circuit receives its four different configuration data sets sequentially in an order that loops from the last configuration data set to the first configuration data set. Such a sequential reconfiguration scheme is referred to as a 4-loopered scheme. Higher order loopered schemes can likewise be implemented.

Figure 11:
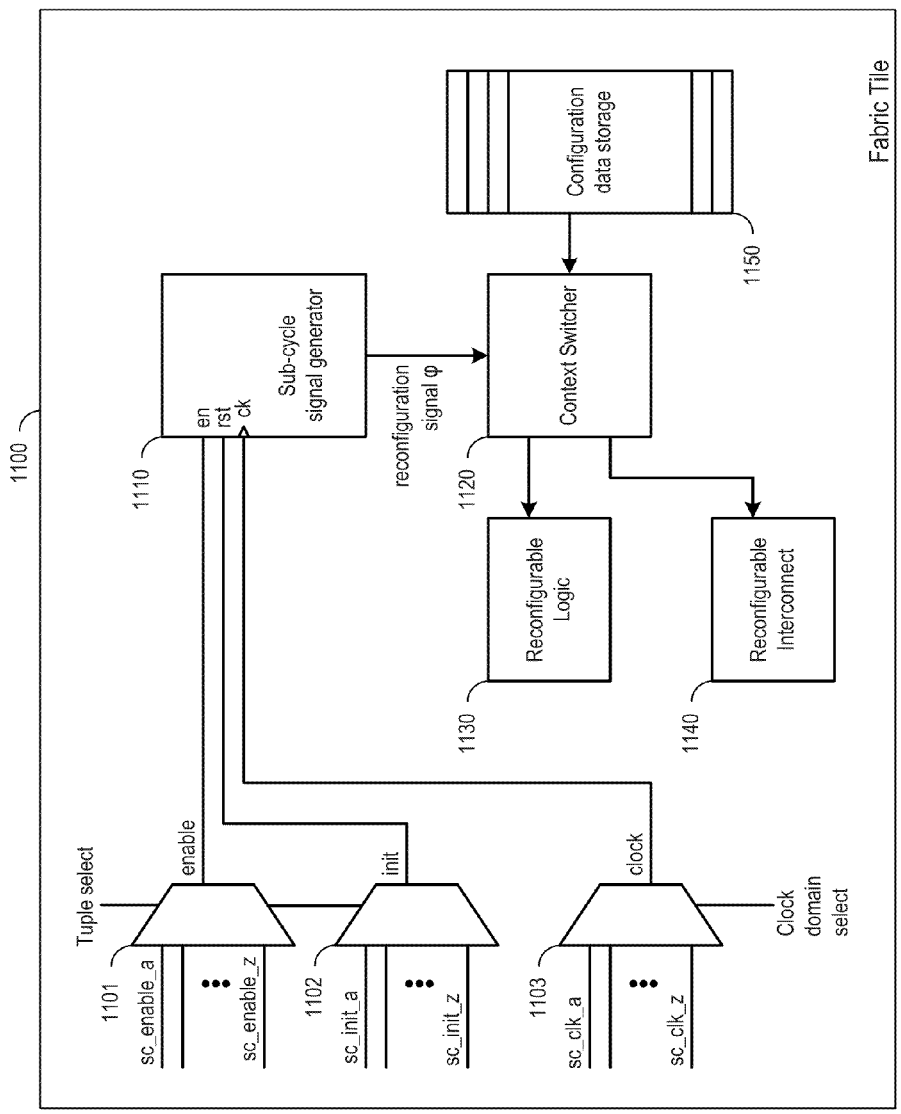
FIG. 11 illustrates an example fabric tile having a local sub-cycle signal generator.

In some embodiments, each tile has its own local sub-cycle signal generator so that different tiles can operate and reconfigure in different clock domains. FIG. 11 illustrates an example fabric tile 1100 having a local sub-cycle signal generator 1110. The fabric tile also includes a context switcher 1120, a reconfigurable logic circuit 1130, a reconfigurable interconnect circuit 1140 and a configuration data storage 1150. Similar to fabric tile 710 of FIG. 7, the fabric tile 1100 also includes multiplexers 1101-1103 for selecting enable, init and clock signals from one of the clock domains.

The sub-cycle signal generator 1110 generates a reconfiguration signal φ to the context switcher 1120, which uses the reconfiguration signal to load different configuration data set from configuration storage 1150 to reconfigure the reconfigurable logic circuit 1130 and reconfigurable interconnect circuit 1140 on every sub-cycle. The operations of the reconfigurable logic and interconnect circuit are discussed above by reference to FIGS. 8-10.

In some embodiments, the sub-cycle signal generator 1110 includes a counter that increments once every sub-clock cycle. In the example of FIG. 11, the sub-cycle clock used to increment the sub-cycle counter is the clock from the clock domain selected by the multiplexer 1103. In some embodiments, such a sub-cycle counter includes one or more registers similar to register 355 of FIG. 3. In some of these embodiments, the sub-cycle counter halts and ceases to increment when the enable signal from the selected clock domain or CMB is de-asserted. The sub-cycle counter resets to a predefined value (e.g., zero) when the init signal from the selected clock domain or CMB is asserted. Some of these embodiments use the init and enable signals to align the sub-cycle (or reconfiguration) signal generation by lifting the reset signal (de-asserting init) and re-enabling the sub-cycle counter at the appropriate time. The alignment of sub-cycle or reconfiguration signal generation will be described further below by reference to FIGS. 12-16.

In some embodiments, a fabric tile has two local sub-cycle signal generators. The two sub-cycle signal generators in the fabric tile are for the fabric tile to simultaneously operate in two clock domains. In the example of FIG. 7, the routing multiplexers 760 and 765 of the tile 710 can operate and reconfigure in a first clock domain using a first local sub-cycle signal generator (such as 1110) and a first configuration data storage (such as 1150), while the input select multiplexer 745, 750, 755 and the LUT 740 operate and reconfigure in a second clock domain using a second local sub-cycle signal generator and a second configuration data storage. This is beneficial for allowing the fabric to route signals that belong to one clock domain while performing logic operation in another clock domain.

While the above described reconfigurable circuits reconfigure in sub-cycles of a user design clock cycle, one of ordinary skill in the art will understand that in some embodiments, the reconfiguration cycles are not part of a larger user design clock cycle. Accordingly, any features described herein as using sub-cycles can also be implemented in some embodiments with reconfiguration cycles that are not sub-cycles of a longer user design clock cycle. In some such embodiments, multiple reconfigurations of the reconfigurable circuits are performed cyclically based on a reconfiguration clock cycle. In some such embodiments, some reconfigurable circuits reconfigure sequentially through a sequence of configurations over the course of multiple reconfiguration cycles, then repeat the sequence of configurations multiple times.

IV. CMB and Sub-Cycle Alignment

As mentioned above, sub-cycle operations of the reconfigurable circuits are based on sub-cycle clocks of a primary clock (or user clock). In some embodiments, each sub-cycle clock is generated by a phase-locked loop (PLL), which uses the primary clock as its reference clock input. Reconfigurable circuits in a tile operate according to a sub-cycle signal generator, which in some embodiments is implemented as a sub-cycle counter that tracks phases of the primary clock. As reconfigurable circuits in a tile can be configured to operate in one of several clock domains, and as each of the clock domains can be configured to receive its clock from one of several primary clocks, it is necessary in some embodiments for a fabric tile to align its sub-cycle signal generator with the primary clock source of its clock domain.

Before a fabric tile aligns its sub-cycle signal generator with the primary clock source, some embodiments first align a shadow sub-cycle counter in the clock domain with the primary clock. In some of the these embodiments, the CMB of the clock domain controls both the alignment of the shadow sub-cycle counter with the primary clock and the alignment of the sub-cycle signal generators in the fabric tiles with the shadow sub-cycle counter.

In some embodiments, the CMB first aligns the shadow sub-cycle counter with the corresponding primary clock by detecting the start of the primary clock cycle. After aligning the shadow sub-cycle counter, the CMB uses its enable and init signals to align the fabric tile's reconfiguration signal generator with the shadow sub-cycle counter.

Figure 12:
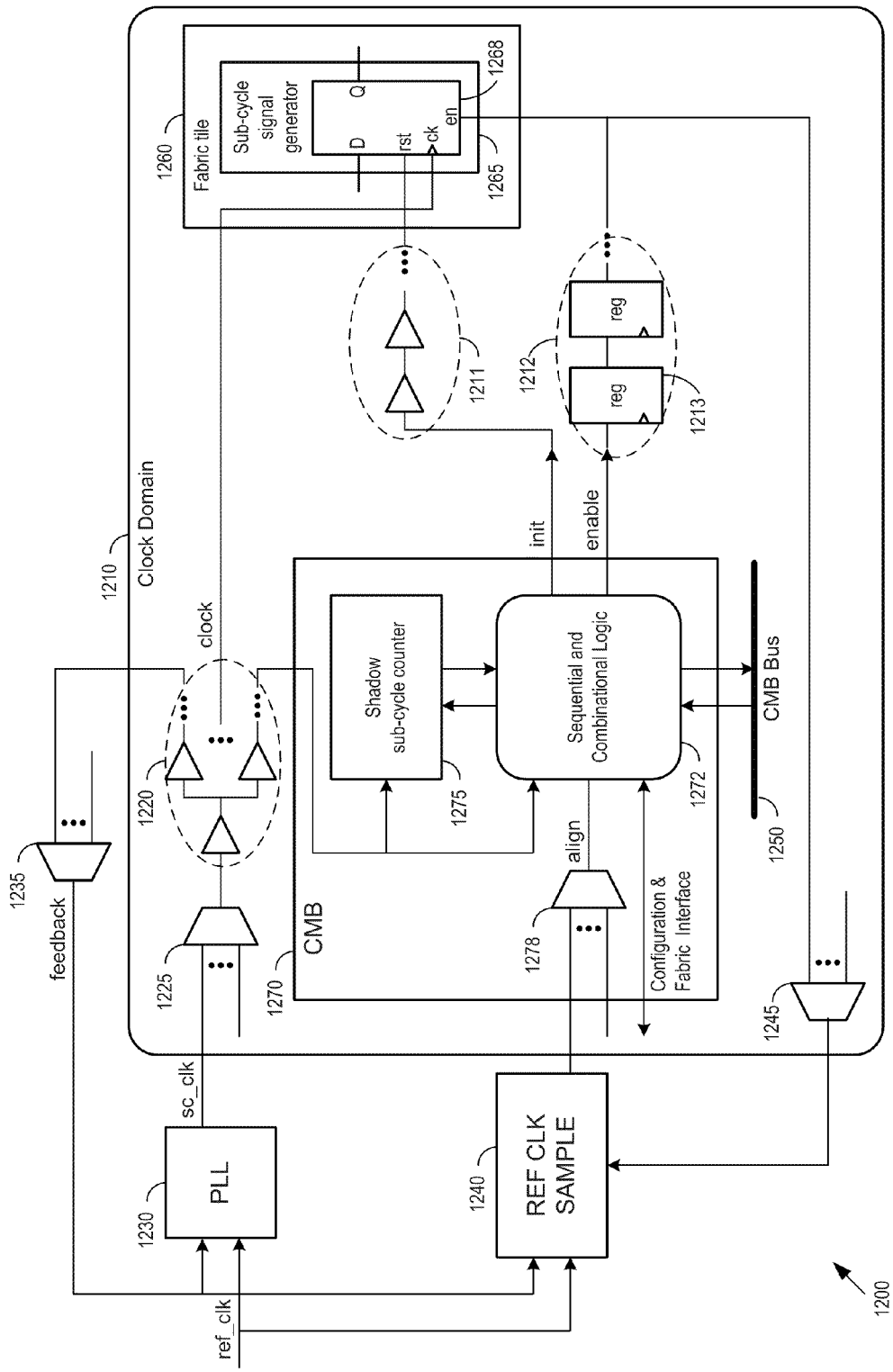
FIG. 12 illustrates an example IC that includes a CMB for aligning reconfiguration sub-cycle signal generation with a primary clock source of a sub-cycle clock.

For some embodiments, FIG. 12 illustrates an example IC 1200 that includes a CMB 1270 for aligning reconfiguration sub-cycle signal generation in the fabric tiles with a primary clock source. As illustrated, the IC 1200 includes a PLL 1230, a reference clock sampling block 1240, a clock feedback multiplexer 1235, and a clock domain 1210. One of ordinary skill would recognize that the IC 1200 is similar to the IC 200 of FIG. 2 and that there can be multiple PLLs, multiple reference clock sampling blocks, multiple clock domains and multiple feedback multiplexers in the IC 1200.

The PLL 1230 receives a feedback clock from the feedback multiplexer 1235, which selects from one of several clock domains (including clock domain 1210) as the feedback clock to the PLL 1230. The PLL 1230 uses the feedback and the reference clock (ref_clk) to generate a sub-cycle clock (sc_clk), which is one of the clocks to be selected by the local clock selection multiplexer 1225. Both the reference clock and the feedback are also routed to a reference clock sampling module 1240, which also receives a delayed version of the enable signal via an enable feedback multiplexer 1245. The reference clock sampling module 1240 provides an alignment indicator 'align' signal to the clock domain 1210.

The clock domain 1210 includes a CMB 1270, a clock distribution network 1220, a sub-cycle clock selection multiplexer 1225, and an enable signal feedback multiplexer 1245. The clock domain 1210 also includes an init signal distribution network 1211 and an enable signal distribution network 1212. The clock domain 1210 includes a fabric tile 1260, which can be one of several fabric tiles that are configured to operate in the clock domain 1210. The fabric tile 1260 includes a sub-cycle signal generator 1265, which includes a sub-cycle counter implemented with registers such as the register 1268. The register 1268 has 'en', 'rst' and 'ck' ports that are connected to enable, init and clock signals. The sub-cycle signal generator asynchronously resets to a predefined value when the CMB 1270 asserts the init signal. The sub-cycle signal generator stops incrementing when the CMB de-asserts the enable signal. In some embodiments, the sub-cycle signal generator 1265 is similar to the sub-cycle generator 1110 of FIG. 11.

The CMB 1270 of FIG. 12 provides init and enable signals to the clock domain 1210 and receives sub-cycle clocks from the PLL 1230. The CMB 1270 and the clock domain operate on the same local clock sourced from the local clock selection multiplexer 1225 via the clock distribution structure 1220. The CMB 1270 includes an alignment multiplexer 1278 that selects an 'align' signal from one of several signals generated from reference clock sampling modules (such as 1240). The CMB 1270 also includes a sequential and combinational logic 1272 and a shadow sub-cycle counter 1275. Similar to the sequential and combinational logic 320 of FIG. 3, the sequential and combinational section 1272 communicates with a CMB bus 1250 and generates the init and enable signals in the clock tuple. Moreover, the sequential and combinational logic 1272 also uses the 'align' signal selected from the reference clock sampling modules and the shadow sub-cycle counter 1275 to generate the enable and init signals.

In some embodiments, the sequential and combinational logic 1272 also communicates with a configuration network and/or a fabric of configurable circuits via the CMB's configuration interface and fabric interface. In some of these embodiments, the CMB 1270 enters or leaves one of its operational modes (such as FREERUN or SYNC2PLL as described in Section V below) when the logic 1272 receives signals from the configuration interface and/or fabric interface.

In some embodiments, the CMB 1270 aligns the sub-cycle (reconfiguration) signal generation with the reference clock that is used to generate the sub-cycle clock. In some of these embodiments, the CMB 1270 first uses the reference clock sampling module 1240 together with the shadow sub-cycle counter 1275 to ascertain the first sub-cycle (sub-cycle 0) in a reference clock cycle. Once the first sub-cycle of the reference clock cycle is determined, some embodiments then use the shadow sub-cycle counter to synchronize the sub-cycle signal generators (such as 1265) in the fabric with the 'sub-cycle 0' of the reference clock.

The reference clock sampling module 1240 facilitates the determination of the 'sub-cycle 0' by providing an alignment indication to the CMB 1270. In some embodiments, the reference clock sampling module generates the alignment indication by sampling the reference clock whenever it receives a pulse on its 'enable' input. The alignment indication is sent to the CMB to allow the CMB to detect the start of the reference clock cycle.

Figure 13:
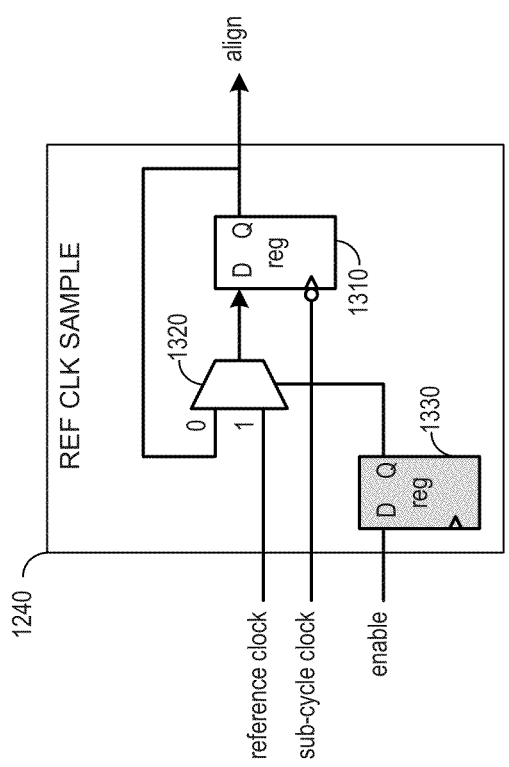
FIG. 13 illustrates an example of a reference clock sampling module.

For some embodiments, FIG. 13 illustrates an example of the reference clock sampling module 1240. As illustrated, the example reference clock sampling module includes an align signal register 1310, a multiplexer 1320, and an optional enable signal delay register 1330.

The align signal register 1310 samples the reference clock whenever the multiplexer 1320 receives a '1' or "high" from the enable signal delay register 1330. The optional enable signal delay register 1330 delays the enable signal received from the CMB 1270. In some embodiments, the enable signal delay register includes several delay stages that are used to account for the timing difference between the enable signal received by the reference clock sampling module 1240 and the enable signal received by the sub-cycle signal generator 1265. In some embodiments, an enable signal delay register is not needed because there is no timing difference between the enable signal received by the reference clock sampling module 1240 and the enable signal received by the sub-cycle signal generator 1265.

Instead of receiving the enable signal from the end of the enable signal distribution network 1212, the reference clock sampling module 1240 in some cases receives the enable signal from a particular delay stage (e.g., after register 1213) of the distribution network 1212. In some of these embodiments, the timing difference between the enable signal received by the reference clock sampling module and the enable signal received by the sub-cycle signal generator would be less and the number of delay stages in the enable signal delay register 1330 can be accordingly reduced.

Alignment using the reference clock sampling module is accomplished by having the CMB 1270 gradually shift the enable signal with respect to the shadow sub-cycle counter. The CMB records the sub-cycle count from the shadow sub-cycle counter 1205 as 'sub-cycle 0' when a transition is detected on the 'align' signal from the reference clock sampling module 1240. An example of this alignment operation is described below by reference to FIG. 14.

Figure 14:
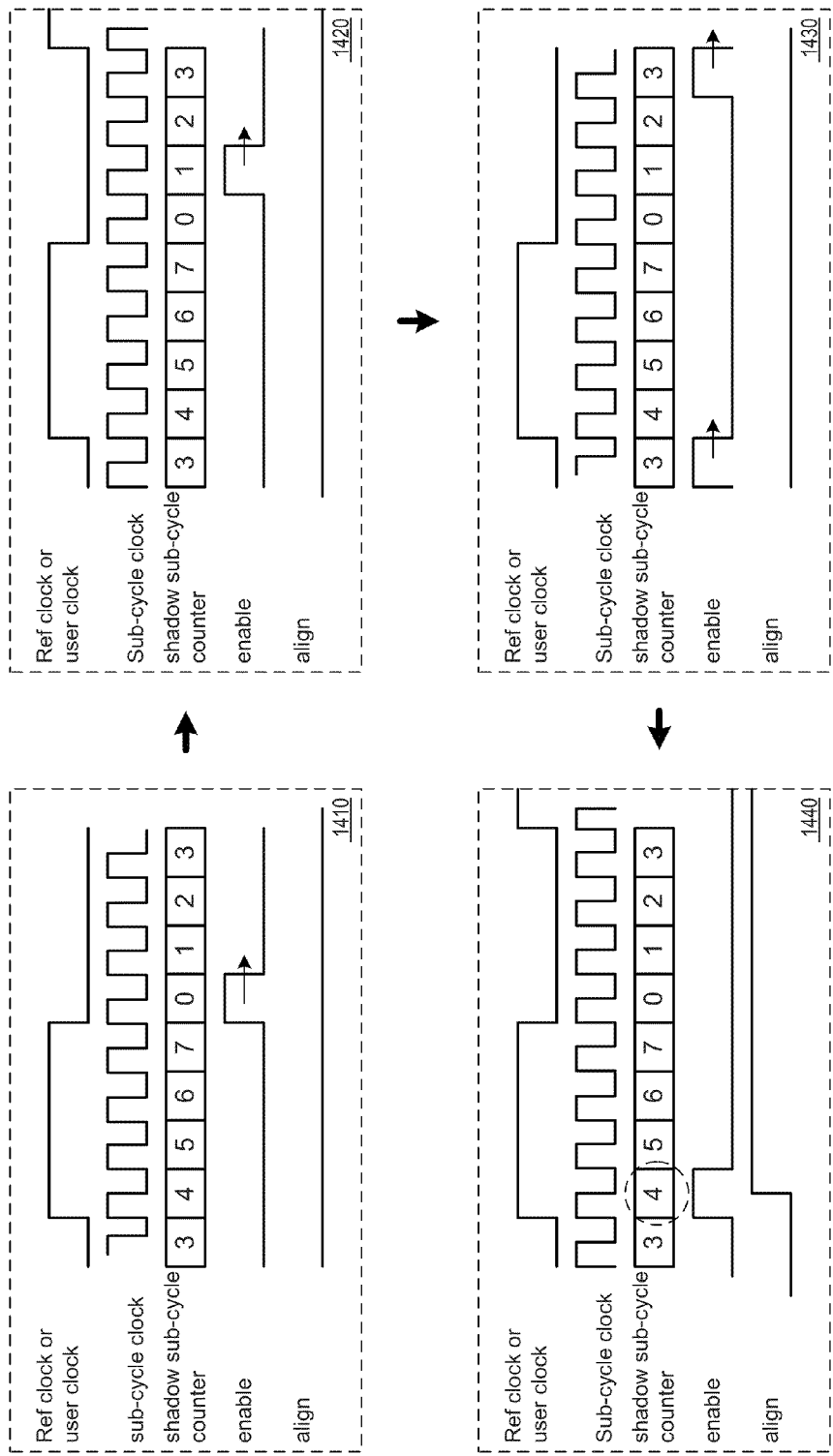
FIG. 14 illustrates an example timing diagram for using a CMB and a reference clock sampling module to determine the position of 'sub-cycle 0' in a reference clock cycle.

FIG. 14 illustrates an example timing diagram for using the CMB 1270 and the reference clock sampling module 1240 to determine the position of 'sub-cycle 0' in a reference clock cycle. In four stages 1410-1440, the timing diagrams shows signal levels of the reference clock of the PLL 1230, the sub-cycle clock of the clock domain 1210, the count at the shadow sub-cycle counter 1275, the enable signal received by the reference clock sampling module 1240, and the 'align' signal generated by the reference clock sampling module.

At the first stage 1410, the count of the shadow sub-cycle counter is not aligned with the reference clock, and the enable signal corresponds to count 0 of the shadow sub-cycle counter. Since the reference clock is at logic low when the enable signal is asserted, the 'align' signal will remain at logic low. In some embodiments, the CMB 1270 keeps the init signal asserted so the enable signal would not affect the reconfiguration signal generator or the configurable circuits.

At the second stage 1420, the CMB 1270 moves the enable signal to correspond to count 1 of the shadow sub-cycle counter. Since the reference clock is at logic low when the enable signal is asserted, the 'align' signal remains at logic low. Likewise at the third stage 1430, the 'align' signal remains at logic low when the CMB 1270 moves the enable signal from count 2 to count 3 because the reference clock is still at logic low during those sub-cycle counts.

Finally at the last stage 1440, the CMB 1270 moves the enable signal to count 4 of the shadow sub-cycle counter. The reference clock sampling module here samples logic high on the reference clock and transitions the 'align' signal from low to high. The CMB detects this transition and records count 4 as being the position of the first sub-cycle (sub-cycle 0) of the reference clock. One of ordinary skill would recognize that any edge-detection techniques commonly known in the art can be used to detect this transition on the 'align' signal (e.g., by comparing 'align' in one sub-cycle with the 'align' signal in the next sub-cycle).

FIGS. 13 and 14 describe the mechanisms for determining the position of the first sub-cycle (sub-cycle 0) of the reference clock for some embodiments. In other embodiments, different mechanisms are used to determine the position of 'sub-cycle 0'. Instead of using an 'enable' signal to sample the reference clock in the reference clock sampling module, some embodiments generate the 'align' signal whenever a rising edge (or falling edge) of the reference clock has been detected by an edge-detection circuitry. In some of these embodiments, this 'align' pulse is used by the CMB 1270 to record the count at the shadow sub-cycle counter as being the first sub-cycle (sub-cycle 0) of the reference clock. In some other embodiments, the reference clock sampling functionality in the reference clock sampling module is incorporated as part of the CMB module. In some of these embodiments, each CMB has a reference clock multiplexer for selecting a reference clock from one of the PLLs.

Returning to FIG. 12, after determining the position of the first sub-cycle (sub-cycle 0), some embodiments align the sub-cycle signal generator 1265 in the fabric tile 1260 according to the determined sub-cycle 0. In some of these embodiments, the CMB aligns the sub-cycle signal generator with the reference clock by controlling the assertion and de-assertion of the init and enable signals sent to the registers 1268 in the sub-cycle signal generator 1265. For some embodiments, FIG. 15 conceptually illustrates a process 1500 for using a CMB to align a sub-cycle (reconfiguration) signal generator with a reference clock. In some of these embodiments, this process is performed as part of a preparation for starting user design operations in a fabric of configurable and/or reconfigurable circuits.

The process 1500 starts when an IC receives an instruction to perform an alignment of sub-cycle signal generators in fabric tiles that are configured to be in a particular clock domain. In some of these embodiments, the system sends this instruction to the IC after configuring the CMB of the particular clock domain as a master CMB or a slave CMB.

The process then resets (at 1510) reconfigurable circuits in the fabric tiles by resetting the sub-cycle signal generators. The reconfigurable circuits reset to a predetermined state when the sub-cycle signal generators of the fabric tiles receive the init signal from the CMB. Some embodiments keep the 'init' signal asserted until after the position of sub-cycle 0 has been determined in 1520.

Next, the process determines (at 1520) the position of sub-cycle 0 in the reference clock cycle. In some embodiments, the process uses the CMB and a reference clock sampling module to determine the position of sub-cycle 0 as discussed above by reference to FIGS. 12-14. In some of these embodiments, determining the position of sub-cycle 0 requires the use of the enable signal. Some embodiments thus keeps the init signal asserted so the toggling of the enable signal would not affect the sub-cycle signal generators and the reconfigurable circuits.

Next, the process de-asserts (at 1530) the enable signal to the fabric tiles. This is to ensure that the sub-cycle signal generators remain in reset state after the process de-asserts the init signal in 1540.

The process then de-asserts (at 1540) the init signal. Some embodiments de-assert the init signal before re-asserting the enable signal because the init signals is an asynchronous signal distributed by an asynchronous distribution network such as 340 of FIG. 3. In some other embodiments that distributes init signal synchronously, the process de-assert init and assert enable at the same time.

In some embodiments, a CMB configured as a master CMB remains in 1530 or 1540 until all slave CMBs that are in the master-slave arrangement with the master CMB have finished their alignment operations.

The process next asserts (at 1550) the enable signal at a sub-cycle count that corresponds to the previously determined 'sub-cycle 0'. In some embodiments, asserting the enable signal according to sub-cycle 0 synchronizes the sub-cycle generator by allowing the counter in the sub-cycle generator to resume counting at the correct sub-cycle count. In some embodiments, a synchronous distribution network such as 330 or 1212 for the enable signal ensures that all the sub-cycle signal generators within the distribution network will receive the enable signal at the same sub-clock cycle.

In some embodiments, the distribution network for the enable signal introduces one or more clock cycles of delay. For some of these embodiments, the sub-cycle generators have reset states that reflect the delay in the distribution network. In some other embodiments, the CMB delays the assertion of enable signal relative to the sub-cycle 0 so the sub-cycle signal generators will receive the enable signal at the correct sub-cycle count.

After asserting the 'enable' signal to allow reconfiguration operations to proceed, the process ends.

Figure 16:
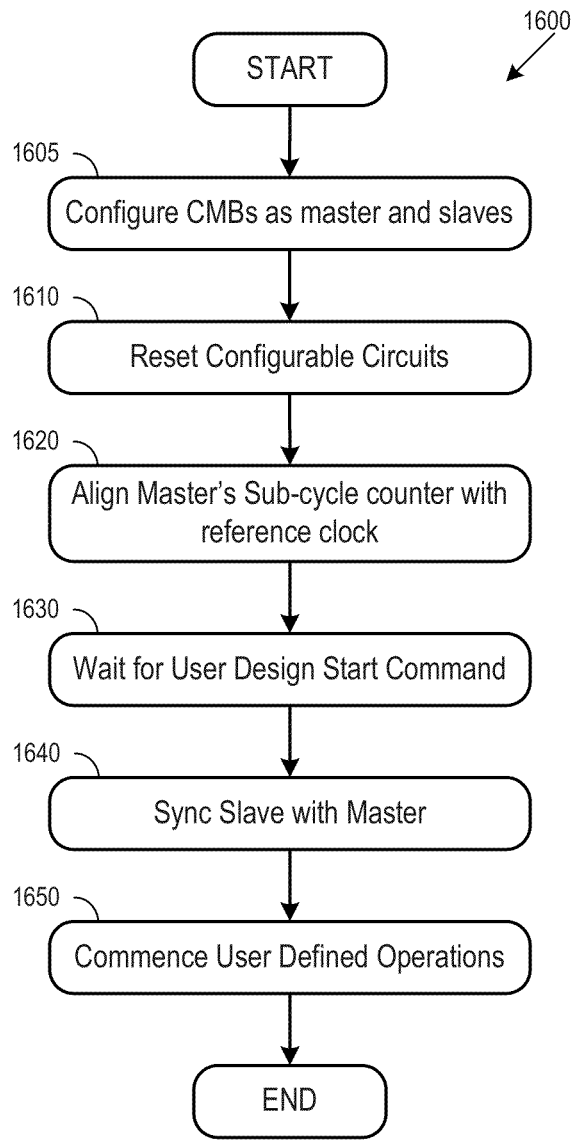
FIG. 16 conceptually illustrates a process for aligning two or more clock domains to a reference clock of a same PLL using master and slave CMB arrangements.

In some embodiments, the process 1500 that aligns a sub-cycle signal generator with a reference clock is a part of a process for aligning two or more clock domains to the reference clock of a same PLL. FIG. 16 conceptually illustrates such a process 1600. The process 1600 starts when the IC receives a command to align one or more clock domains to a clock source.

The process then configures (at 1605) a CMB as a master CMB of a master-slave arrangement and one or more other CMBs as slave CMBs of the master-slave arrangement.

Next, the CMBs in the master-slave arrangement reset (at 1610) the configurable circuits in their respective clock domains by asserting the init signal.

The master CMB aligns (at 1620) its own shadow sub-cycle counter to an edge of a reference clock. As described above by reference to FIG. 14, a CMB in some embodiments performs the alignment operation by determining the first sub-cycle or 'sub-cycle 0' in the reference clock cycle by pulsing the enable signal at different sub-cycle counts. In some of these embodiments, a CMB configured to be a master does not enable the sub-cycle signal generator until after the slave CMBs have also completed alignment operations at 1640. After the master CMB has completed alignment of its shadow sub-cycle counter, the process proceeds to 1630.

The process 1600 enters (at 1630) a waiting period, during which the CMBs in the master-slave arrangement de-assert both the enable and init signals. When the init signal is de-asserted, the configurable circuits are ready to start user-designed operations. However, with enable still de-asserted, the configurable circuits will remain halted in reset state until the CMBs assert enable. In some embodiments, the process remains in 1630 until the IC receives a command to start user defined operations, upon which the process proceeds to 1640.

The process 1600 then syncs (at 1640) the slave CMBs with the master CMB. The slave CMBs align their shadow sub-cycle counters with a signal received from the master CMB (e.g., the 'Extsync' signal of the CMB bus). Next, the process 1600 starts (at 1650) user-defined functional operations by having the CMBs in the master-slave arrangement lift their enable signals. With the shadow sub-cycle counters of the CMBs already aligned, the configurable circuits in the clock domains controlled by the CMBs commence user-defined functional operations at the correct sub-cycle or reconfiguration state with respect to each other and with respect to the reference clock. For some embodiments that include runtime reconfigurable circuits, the sub-cycle signal generators are now properly aligned so that reconfiguration operations such as loopering can commence. In some embodiments, the CMB bus connections between master and slave CMBs ensure that the master and slave CMBs lift their enable signals in a predetermined timing relationship (e.g., simultaneously or at a known offset) so that the user defined functionalities will start in the correct state. After starting the user-defined operations, the process 1600 ends.

As discussed above, a CMB in some embodiments includes a state machine that (1) controls communication with other CMBs via a CMB Bus, (2) controls the init signal and the enable signal to circuits in the clock domain, and (3) determines sub-cycle alignment with the reference clock. For some of these embodiments, FIG. 17 conceptually illustrates an example state machine 1700 that implements some or all of these functions.

Figure 17:
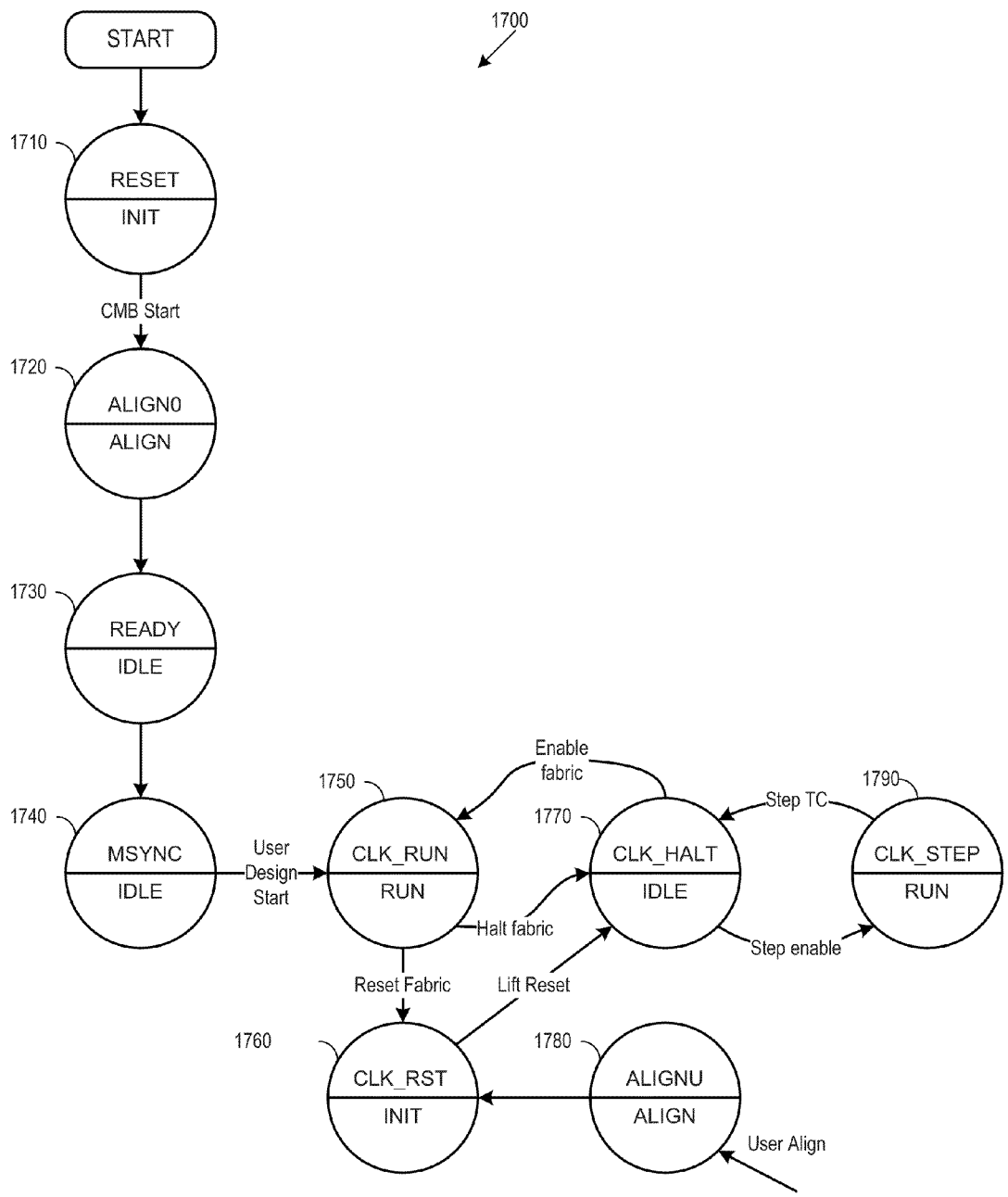
FIG. 17 conceptually illustrates an example state machine that implements a process for using a CMB to align a sub-cycle signal generator with a reference clock and for aligning multiple clock domains to the reference clock using master and slave CMB arrangements.

In FIG. 17, the top half of each bubble represents the state of the CMB, the bottom half of each bubble represents the output state of the CMB. Each output state (INIT, ALIGN, IDLE and RUN) is associated with the 'init' and 'enable' signals outputted by the CMB. Table 2 below explains the four output state of a CMB (INIT, ALIGN, IDLE, RUN). In some embodiments, each output state of the CMB also corresponds to one of four Fabric States, each of which reflects the state of the reconfigurable circuits operating in the clock domain controlled by the CMB:

TABLE 2

| CMB Output State | | | |
|---|---|---|---|
| CMB Output State | 'init' | 'enable' | Fabric State |
| INIT | 1 | X (don't care) | Sub-cycle signal generator at reset |
| ALIGN | 1 | pulsed | Sub-cycle signal generator at reset |
| IDLE | 0 | 0 | Sub-cycle signal generator halt |
| RUN | 0 | 1 | Sub-cycle advances |

The RESET state 1710 has the CMB output state INIT. For some embodiments, this state corresponds to operation 1610 of the process 1600 in FIG. 16. In some embodiments, the CMB enters this state when a command to align the sub-cycle (reconfiguration) signal generators is received. In some other embodiments, the RESET state is the CMB's initial state. The CMB exits from the RESET state upon receiving a command to start the CMB state machine in some embodiments.

The ALIGN0 state 1720 has the CMB output state ALIGN. During the ALIGN0 state, some embodiments perform alignment operation with the reference clock sampling module. For some of these embodiments, the CMB determines the first sub-cycle of a reference clock cycle as described above by reference to FIG. 14. In some of these embodiments, the 'enable' signal pulses while the CMB is determining the first sub-cycle. In some embodiments, only a master CMB performs the alignment operation during the ALIGN0 state while a slave CMB bypasses this alignment operation. For some embodiments, this state corresponds to operation 1620 of the process 1600 in FIG. 16.

The READY state 1730 has the CMB output state IDLE. The READY state 1730 is a CMB wait state. In some embodiments, the CMB will remain in this state until it receives the command to start the CMB state machine. Upon receiving this command, some embodiments wait for a number of clock cycles before transitioning to the MSYNC state 1740. In some of these embodiments, a common configuration clock is used to count this waiting period so the start-up of multiple CMB masters can have a common time reference.

In some embodiments, the fabric of configurable circuits can be programmed (such as loading storage elements 935 and 830) during the READY state since the 'init' output of the CMB is de-asserted. In some embodiments, the CMB is held in READY state for loading manufacturing test state into the fabric. For some embodiments, this state corresponds to operation 1630 of process 1600 in FIG. 16.

The MSYNC (master sync) state 1740 has the output state IDLE. MSYNC is a state during which a master CMB synchronizes its slaves prior to user design start. In some embodiments, master and slave CMBs count synchronization pulses on the CMB Bus as a mechanism to start up various subsections of a clock domain. For some embodiments, this state corresponds to the operation 1640 of the process 1600 in FIG. 16. Upon receiving a command to start user design, some embodiments exit the MSYNC state 1740 and enter CLK_RUN state and start sub-cycle reconfiguration operations in the fabric.

The CLK_RUN state 1750 has the output state RUN. CLK_RUN is the user operational state in which configurable and reconfigurable circuits performs user defined operations. In some embodiments, the CMB asserts 'enable' while de-asserting 'init' so that the sub-cycle/reconfiguration signal generation can proceed. The CMB exits to CLK_RST state when it receives a command to reset the fabric's sub-cycle/reconfiguration operations. The CMB exits to CLK_HALT state 1770 when it receives a command to halt sub-cycle/reconfiguration operation in the fabric.

The CLK_RST state 1760 has the output state INIT. In this state, the CMB asserts 'init' to clear state elements in the fabric. This assertion forces all sub-cycle signal generation counters to reset to the first sub-cycle count. Upon exiting CLK_RST state, the CMB in some embodiments enters the CLK_HALT state 1770.

The CLK_HALT state 1770 has the output state IDLE. In this state, the CMB de-asserts the 'init' signal for the clock domain to freeze the fabric in the current sub-cycle/reconfiguration state. The CMB exits from CLK_HALT state 1770 to CLK_RUN state 1780 when sub-cycle signal generation in the fabric no longer needs to be halted. In some embodiments, the CMB controls the exiting from the CLK_HALT state 1770 (i.e., lifting 'enable' signal) so that the sub-cycle/reconfiguration signal generation of the fabric will be synchronized with the reference clock. In some of these embodiments, the CMB controls the timing of the exiting of this state according to a shadow sub-cycle counter (such as 1275 of FIG. 12) and a recorded sub-cycle 0.

The ALIGNU state 1780 has the output state ALIGN. In some embodiments, the CMB enters this state whenever the CMB's clock domain has been configured to use a new sub-cycle clock and the CMB needs to align with the reference clock that is used to generate the new sub-cycle clock. During the ALIGNU state, the CMB in some embodiments asserts the init signal to keep reconfigurable circuits in a reset state while using the enable signal to perform alignment of the clock domain as described above by reference to FIGS. 14 and 15.

In some embodiments, configuring a clock domain to use a new sub-cycle clock involves stepping the CMB through both ALIGNU and CLK_RST states.

The CLK_STEP state 1790 has the output state RUN. In some embodiments, CLK_STEP is a conditional sub-set of the CLK_HALT state that supports incremental advancement of the sub-cycle counters for a programmed number of steps. In some embodiments, the number of steps is determined by a sub-cycle counter value set by the configuration network control via the configuration interface. Some embodiments use this start-and-stop operation to control the startup sequencing and sub-cycle alignment of clock domains. The operation can also be used to program the multiple CMBs to startup up simultaneously or alternatively in an arbitrarily programmed sequence. Some embodiments use this operational mode to support manufacturing tests by letting the configuration network control the CMB and the clock domain.

One of ordinary skill in the art will recognize that these CMB states and CMB output states are only for conceptually illustrating an example CMB state machine for some embodiments. Other embodiments can have other CMB states and/or CMB output states that are determined by other sets of instructions or control signals.

V. CMB Operational Modes

A CMB supports various operational modes in some embodiments. These various CMB operational modes are controlled by various device resources in the IC. For example, a CMB and its associated clock domain can be controlled by other CMBs via the CMB bus. A CMB can be controlled by user logics in the fabric via the CMB's fabric interface. A CMB can also be controlled by configuration network via the CMB's configuration interface. A CMB in some of these embodiments supports some or all of the following operational modes:

1. FREERUN is a CMB mode during which sub-cycle 0 is not aligned to any reference clock input of any PLL.

2. SYNC2PLL is a CMB master mode, during which sub-cycle 0 of a master CMB is aligned to a reference clock of a PLL.

3. SYNCONCE is a CMB slave mode, during which sub-cycle 0 of a slave CMB is aligned according to a programmed offset from sub-cycle 0 of a master CMB. In some embodiments, the slave CMB's timing is initialized with respect to its master during startup sequencing as described earlier by reference to FIGS. 15 and 16. Once synchronized, a slave CMB in the SYNCONCE mode operates independently from the master CMB and ignores all commands from the master except for a command to reset the slave CMB.

4. LOCKSTEP is a CMB slave mode, during which the CMB slave mirrors the 'init' and 'enable' signals of its CMB master. In some embodiments, this mode is used to replicate a clock domain. A slave CMB in LOCKSTEP mode mirrors or mimics the master's 'init' and 'enable' signals by tracking the CMB Bus (e.g., by tracking "Extsync" and "Extinit" signals). Some embodiments apply an offset delay to match the 'init' and 'enable' control pair of the CMB slave to that of the CMB master.

In addition to responding to the slave CMB's own fabric input, the slave CMB in LOCKSTEP mode in some embodiments can also respond to the master CMB's fabric input.

In some embodiments, all slave CMBs in a same master-slave arrangement must either be in SYNCONCE mode or LOCKSTEP mode. In some other embodiments, one or more slave CMBs can be in SYNCONCE mode while other slave CMBs are in LOCKSTEP mode.

5. FABRIC I/F is a CMB mode during which configurable circuits in the fabric performing user designed operations can manipulate a clock domain via the fabric interface of the clock domain's CMB. In some embodiments that include reconfigurable circuits, active inputs from the configurable circuits in the fabric are scheduled according to the sub-cycle count of the reconfiguration signal generation. Some embodiments make this scheduling by using a timing reference index (e.g., 3-bit timing reference index for an 8-loopered scheme with 8 sub-cycle scheduling slots). In some embodiments, the scheduling mechanism remains active even if the CMB's init and enable outputs are keeping the CMB's clock domain in reset or in halt. This allows a CMB and its clock domain to be controlled by configurable circuits operating in other clock domains.

In some embodiments, a CMB and its associated clock domain can be controlled by a configuration network via a configuration interface on a CMB module. In some embodiments, the configuration network can override the state of the CMB. In some of these embodiments, the configuration network can also override command from the fabric or the CMB's master. Some of these embodiments allow the CMB to be forced into any state via the configuration interface.

Some embodiments use the configuration interface to control the CMB in order to support manufacturing tests. In some embodiments, the configuration interface can also be used to control a CMB's regular operations. For some of these embodiments, the CMB supports the following additional operational modes via the configuration interface:

6. CLK_RUN is an operational mode in which there is no configuration network command. The CMB is in normal operation.

7. CLK_RESET is an operational mode in which the CMB in some embodiments goes to reset/init state. The CMB's init output is asserted.

8. CLK_HALT is an operational mode in which the CMB in some embodiments goes to the halt state. The CMB's enable and init outputs are both inactive.

9. CLK_STEP is an operational mode in which the CMB in some embodiments advances the clock domain a fixed number of sub-cycles before returning to CLK_HALT. In some embodiments, the number of sub-cycles is determined by a sub-cycle counter value set by the configuration network control via the configuration interface. Some embodiments use this start-and-stop operation to control the startup sequencing and sub-cycle alignment of clock domains. The operation can also be used to program the multiple CMBs to startup up simultaneously or alternatively in an arbitrarily programmed sequence. Some embodiments use this operational mode to support manufacturing tests by letting the configuration network control the CMB and the clock domain.

It should be apparent to one of ordinary skill in the art that these CMB operational modes are only examples, and that other embodiments of the CMB can have other CMB operational modes.

VI. Clock Regions

Figure 18:
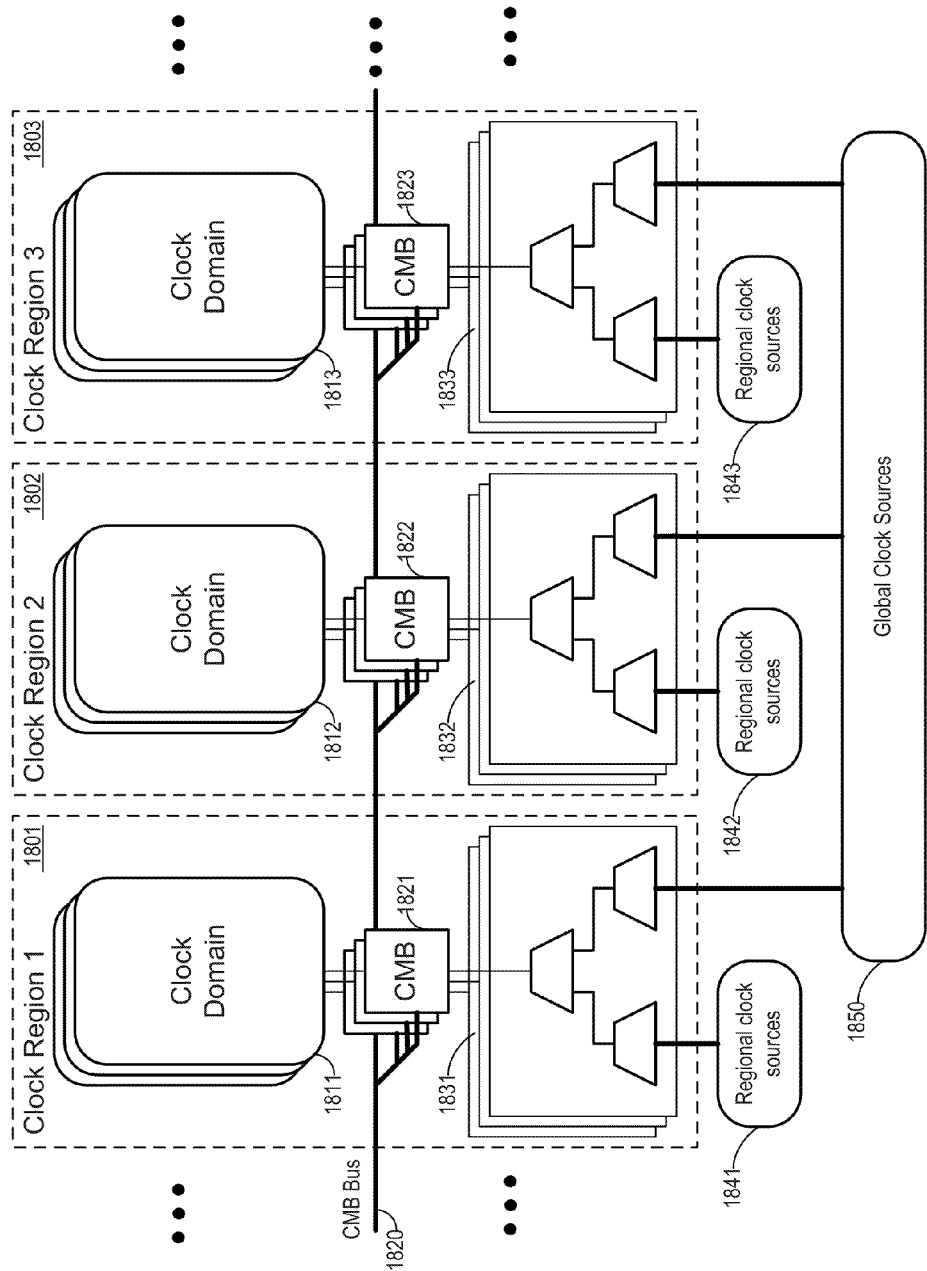
FIG. 18 illustrates an example IC that includes multiple clock regions.

Sections I through V above describe an IC that uses CMBs to configurably route clock resources into different clock domains. In some embodiments, such an IC includes several clock regions. Each clock region of some embodiments includes several clock domains, CMBs and clock sources such as PLLs. FIG. 18 illustrates an example IC 1800 that includes multiple clock regions 1801-1803. As illustrated, each of the clock regions 1801-1803 includes several clock domains (e.g., each of the clock domains 1811 is within the clock region 1801, each of the clock domains 1812 is within the clock region 1802, and each of the clock domains 1813 is within the clock region 1803). Each clock domain in each clock region is associated with a CMB (e.g., each of the CMBs 1821 is associated with each of the clock domains 1811, each of the CMBs 1822 is associated with each of the clock domains 1812, and each of the CMBs 1823 is associated with each of the clock domains 1813). The CMB Bus 1820 interconnects the CMBs within the same clock region and across different clock regions.

Each clock region also includes several multi-level multiplexers in some embodiments. Each multi-level multiplexer selects a clock source for a clock domain and its associated CMB (e.g., each of the multilevel multiplexers 1831 selects a clock for each of the clock domains 1811, each of the multi-level multiplexers 1832 selects a clock for each of the clock domains 1812, and each of the multilevel multiplexers 1833 selects a clocks for each of the clock domains 1813). The number of clock domains/CMBs/multilevel multiplexers illustrated in FIG. 18 is arbitrarily chosen for ease of illustration only. One of ordinary skill in the art would recognize that some other embodiments may include different number of clock domains/CMBs/multilevel multiplexers than what is illustrated in FIG. 18.

The multi-level multiplexers select clocks from the regional clock sources 1841-1843 and the global clock sources 1850. Regional clock sources are available for selection by all CMBs and clock domains in a clock region, and are therefore accessible to all multilevel multiplexers of that region (e.g., the regional clock sources 1841 are for selection by clock domains in the clock region 1801, the regional clock sources 1842 are for selection by clock domains in the clock region 1802, and the regional clock sources 1843 are for selection by clock domains in the clock region 1803.) Global clock sources are available for selection by all CMBs and clock domains in all clock regions, and are therefore accessible to all multilevel multiplexers of all regions Some of these embodiments designate a clock source as either "regional" or "global" based on the physical characteristics of the clock source. Some embodiments make such determination based on physical characteristics such as the location of the clock source in the IC, the width of the wires used for clock distribution in the IC, and the density of the semiconductor components in the IC. For example, some embodiments designates a PLL located near the center of a side of the IC as a global clock source and a PLL located near a corner of the IC as a regional clock source.

In some embodiments, some or all of the clock sources (1841, 1842, 1843 and 1850) are outputs of PLLs. In some of these embodiments, some or all of the PLLs have multiple outputs, and different outputs of the same PLL can serve as regional clock sources to different clock regions. In some embodiments, some of the outputs of some of the PLL can also serve as global clock sources.

In some embodiments, CMBs in different clock regions can form master-slave arrangements by selecting the same global clock source 1850 and communicating through the CMB bus 1820. In some embodiments, some or all of the global clock sources are outputs of PLLs. In some of these embodiments, a PLL can output a clock that serves as a regional clock source while outputting another clock that serves as a global clock source.

Figure 19:
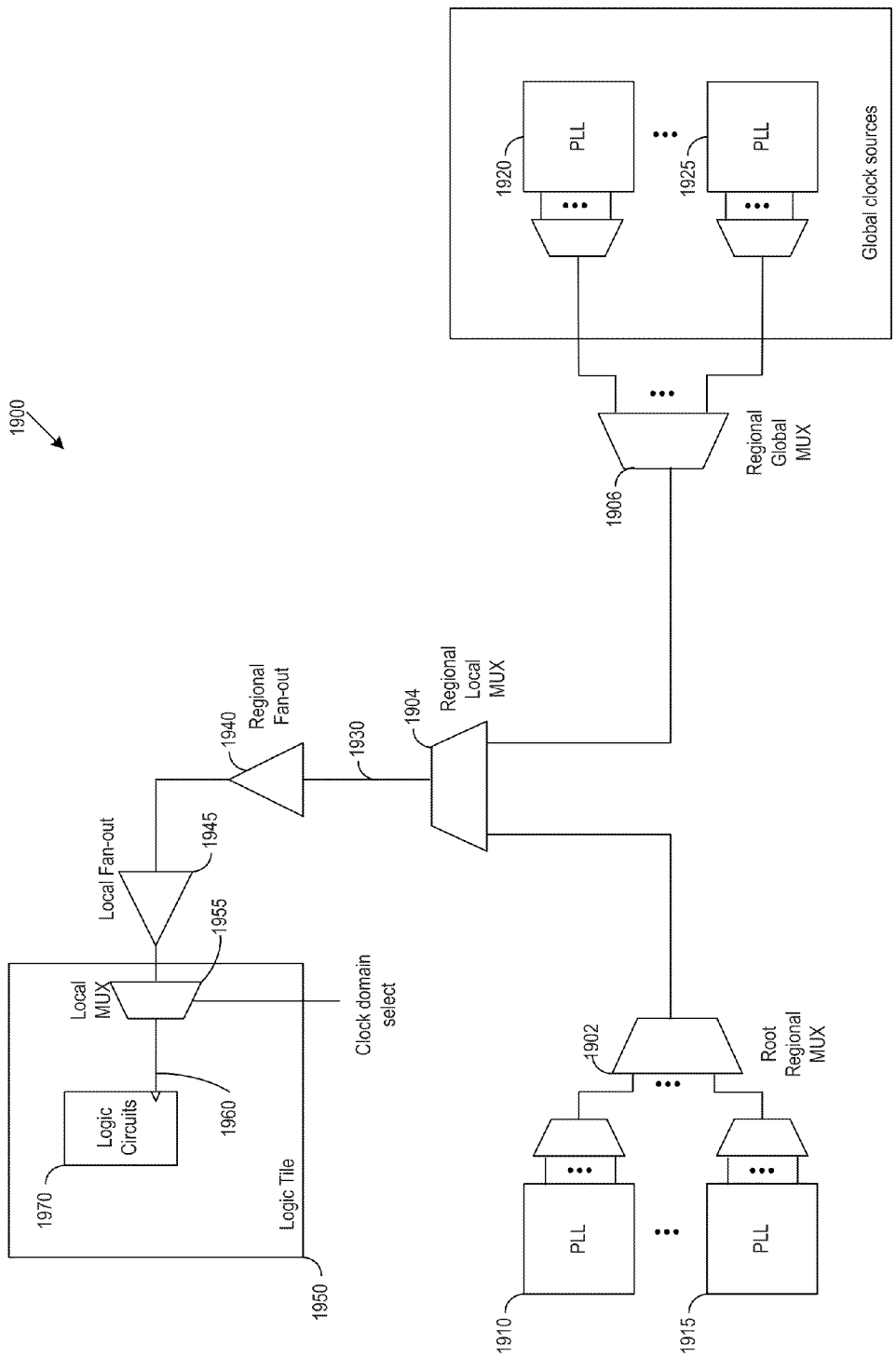
FIG. 19 conceptually illustrates an example clock distribution network in a clock region from clock sources to individual logic tiles.

FIG. 19 conceptually illustrates an example clock region that distributes a clock selected from regional and global clock sources to individual fabric tiles. As illustrated, the clock region 1900 has access to one or more PLLs (e.g, PLLs 1910 and 1915) that can each output one or more clocks as regional clocks of the region 1900. Multiple layers of regional multiplexers (e.g., root regional multiplexer 1902 and regional local multiplexer 1904) can select one of the PLL output clocks for the clock region. In some embodiments, the multiplexers can also select clock outputs from PLLs from other clock regions (e.g., via the regional global multiplexer 1906). The regionally selected clock 1930 is then distributed by a network of fan-out buffers (e.g., regional fan-out buffer 1940 and local fan-out buffer 1945) to a logic tile 1950, which receives several such regionally selected clocks (i.e., different clock domains). A multiplexer 1955 in the logic tile then selects one of the regionally selected clock as the leaf clock 1960 for use by individual logic circuits such as 1970.

VII. Clocking Relationships Between Different Clock Domains

In some embodiments, configurable circuits operating in different clock domains can interface with each other. In some of these embodiments, these configurable circuits operating in different clock domains can be configured to form a same functional module.

There can be different clocking relationships between circuits operating in different clock domains. Different clocking relationships arise because different clock domains can select clocks from (1) the same clock output from the same PLL, (2) different clock outputs from the same PLL at the same frequency, (3) different clock outputs from the same PLL running at different frequencies, and (4) different PLLs.

Figure 20:
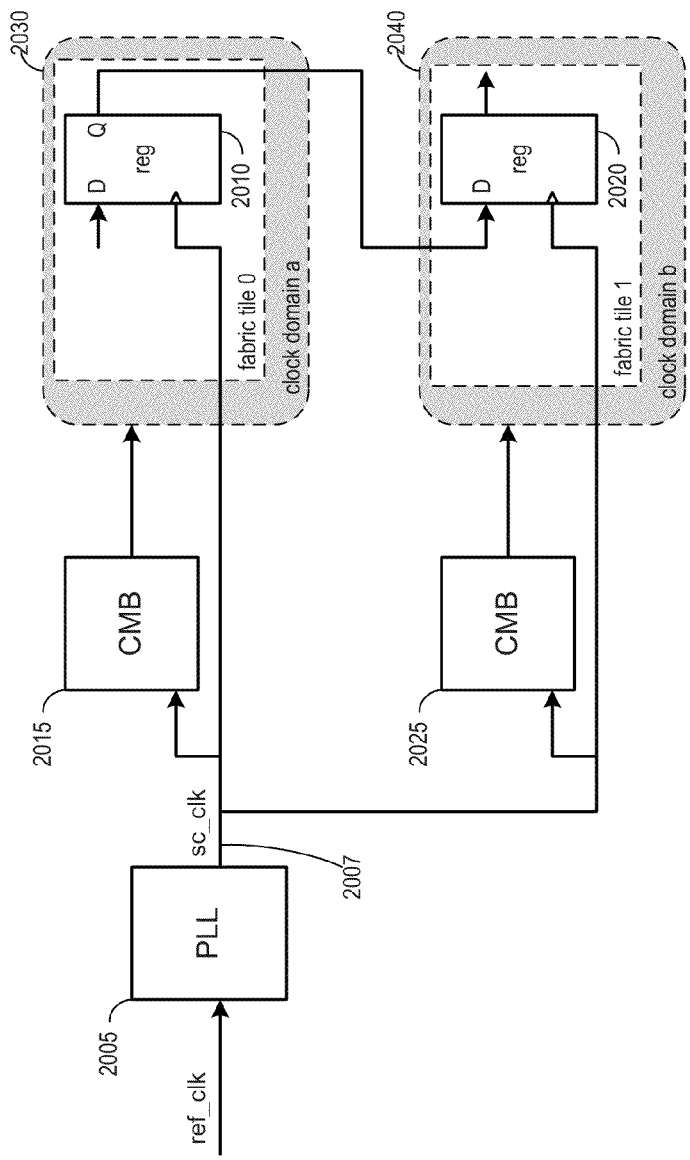
FIG. 20 illustrates an example clocking relationship between two clock domains that select from a same clock output of a same PLL.

FIG. 20 illustrates an example clocking relationship between two clock domains 2030 and 2040 that select from the same clock output of the same PLL. As illustrated, the different sets of sequential circuits 2010 and 2020 are running on sub-cycle clocks that are sourced from the same output 2007 of the same PLL 2005 at the same frequency. However, each clock domain (2030 and 2040) has its own unique control signaling from its own CMB (2015 and 2025). In some embodiments, this clocking relationship is referred to as "derived control clocking" In some of these embodiments, logic circuits in different domains can communicate through a synchronous crossing since the two clock domains share the same phase and frequency with little skew.

Figure 21:
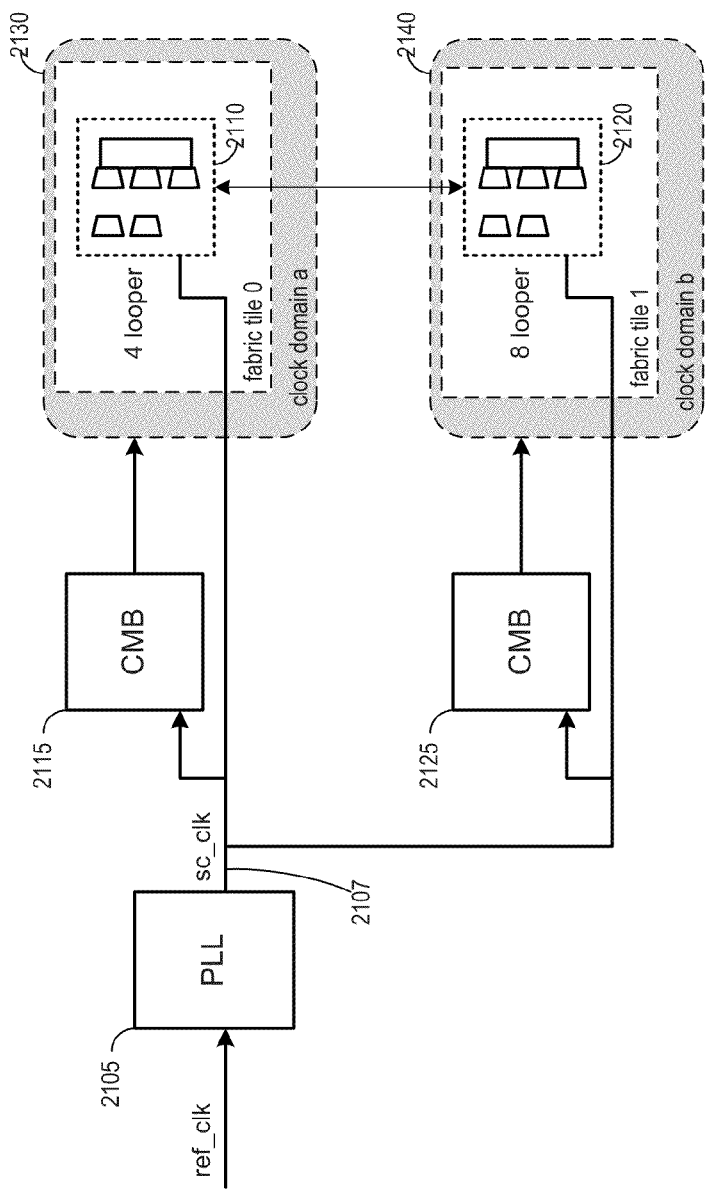
FIG. 21 illustrates an example interface between two clock domains that select from the same clock output of the same PLL but each has its own order of looperness.

FIG. 21 illustrates an example interface between two clock domains 2130 and 2140 that select from the same clock output of the same PLL but each has its own order of looperness. As illustrated, the different sets of reconfigurable circuits 2110 and 2120 are running on sub-cycle clocks that are sourced from the same output 2107 of the same PLL 2105 and at the same frequency. However, configurable circuit 2110 is running on an 8-loopered reconfiguration scheme while configurable circuit 2120 is running on a 4-loopered reconfiguration scheme. In some embodiments, this clocking relationship is referred to as "derived looperness clocking". Configurable circuits operating on different looperness schemes can effectively have different user-design cycles or different user clock rates. For some of these embodiments, circuits that operate on the same sub-cycle clock can handle signal crossings between reconfigurable circuits that are operating on different looperness schemes.

Figure 22:
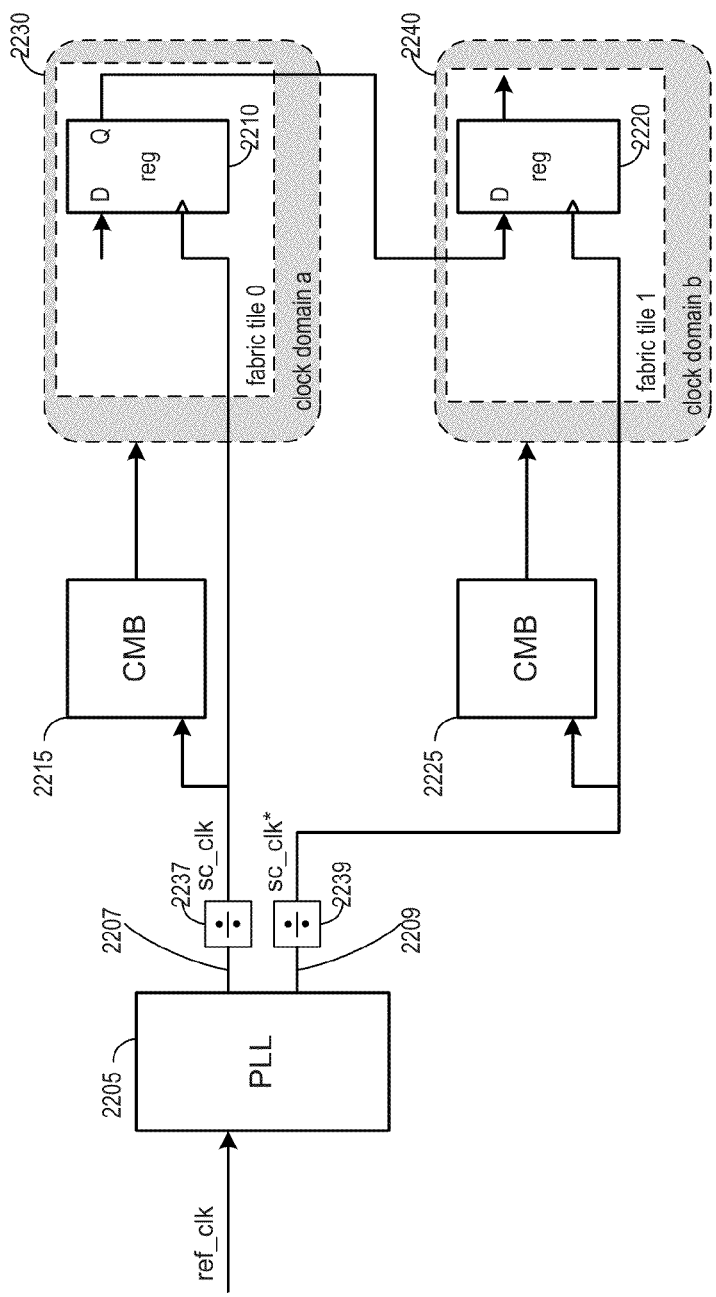
FIG. 22 illustrates an example interface between two clock domains that select from different clock output of a same PLL, in which frequencies of the sub-cycle clocks are at different integer multiples of a base frequency.

FIG. 22 illustrates an example interface between two clock domains that select from different clock outputs of the same PLL. Here, the frequencies of the two sub-cycle clocks driving the two clock domains 2230 and 2240 are at different integer multiples of a base frequency. As illustrated, the different sets of sequential circuits 2210 and 2220 are running on sub-cycle clocks that are sourced from different outputs 2207 and 2209 of the same PLL 2205. Each sub-cycle clock utilizes its own divider 2237 and 2239 and achieves its own frequency. Although the dividers 2237 and 2239 are illustrated in this figure as modules outside of the PLL 2205, some embodiments incorporate the dividers 2237 and 2239 in the PLL module 2205. In some embodiments, each of the dividers results in frequencies higher than that of the reference clock (e.g., when the divider is in the PLL's feedback path). In some embodiments, the dividers result in frequencies lower than that of the reference clock (e.g., when the divider is not in the PLL's feedback path).

In some embodiments, this clocking relationship is referred to as "derived frequency clocking". For some of these embodiments, the phase relationship between the sub-cycle clocks is known and the logic circuits in different clock domains can communicate through a synchronous crossing.

Figure 23:
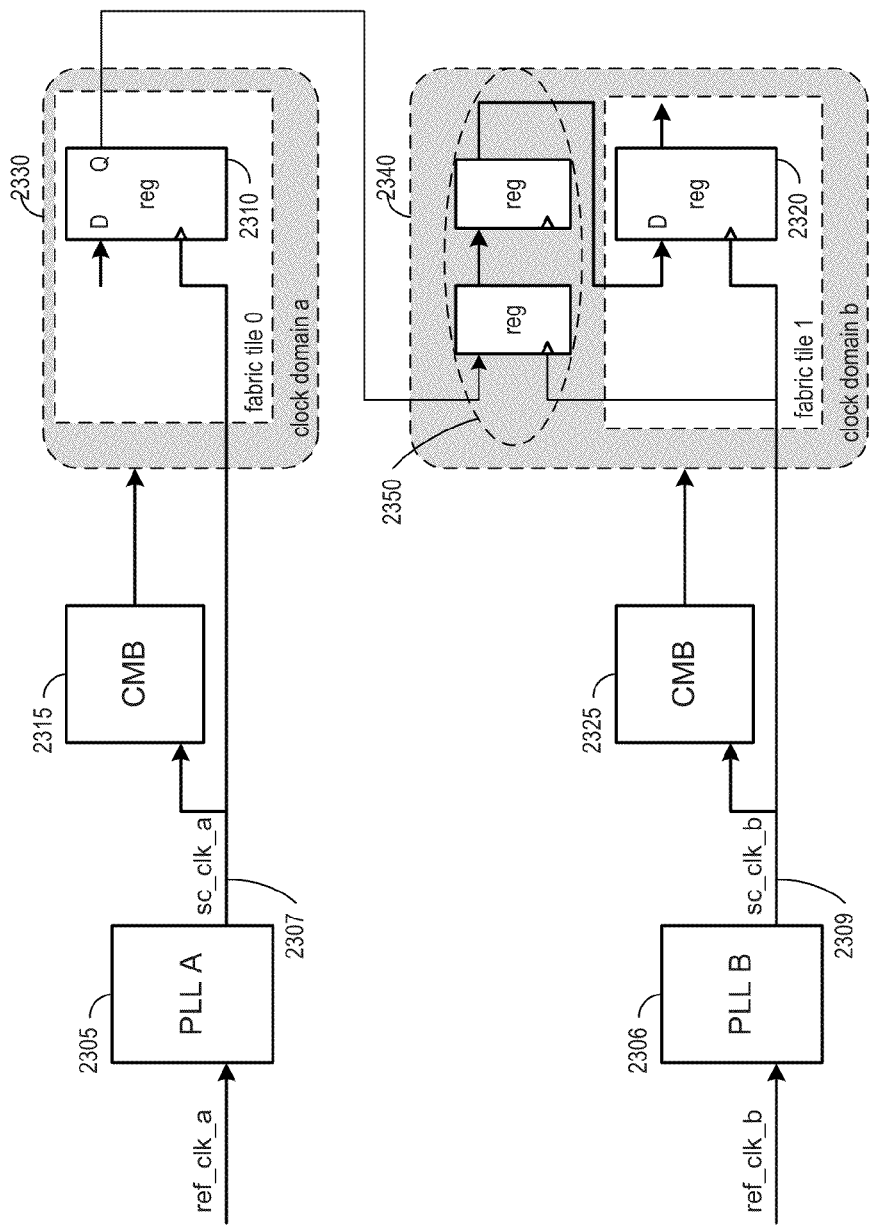
FIG. 23 illustrates an example interface between two clock domains that select from different clock outputs from different PLLs.

FIG. 23 illustrates an example interface between two clock domains 2330 and 2340 that select from different clock outputs of different PLLs. As illustrated in this example, the different sets of sequential circuits 2310 and 2320 are running on sub-cycle clocks that are sourced from different outputs 2307 and 2309 of the different PLLs 2305 and 2306. There is no common divider value between the two sub-cycle clocks, and the phase relationship between the sub-cycle clocks is unknown in this example. In some embodiments, this clocking relationship is referred to as "asynchronous clocking". In this instance, asynchronous crossing techniques well known in the art can be used to handle the signal crossings between the two sets of configurable circuits.

VIII. Configurable IC and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value). Some embodiments described above are implemented in configurable ICs that can perform a continuous function. In these embodiments, the configurable IC can receive a continuous function at its input, and in response, provide a continuous output at one of its outputs.

Figure 24:
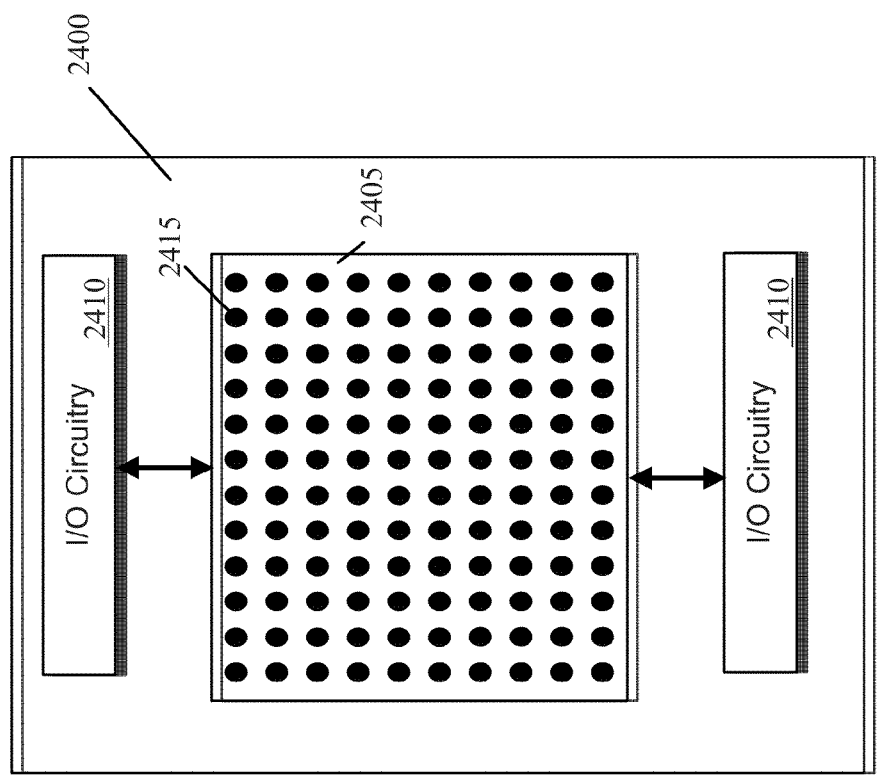
FIG. 24 illustrates a portion of a configurable IC.

FIG. 24 illustrates a portion of a configurable IC 2400 of some embodiments of the invention. As shown in this figure, this IC has a configurable circuit arrangement 2405 and I/O circuitry 2410. The configurable circuit arrangement 2405 can include any of the above described circuits, storage elements, and routing fabric of some embodiments of the invention. The I/O circuitry 2410 is responsible for routing data between the configurable nodes 2415 of the configurable circuit arrangement 2405 and circuits outside of this arrangement (i.e., circuits outside of the IC, or within the IC but outside of the configurable circuit arrangement 2405). As further described below, such data includes data that needs to be processed or passed along by the configurable nodes.

Figure 25:
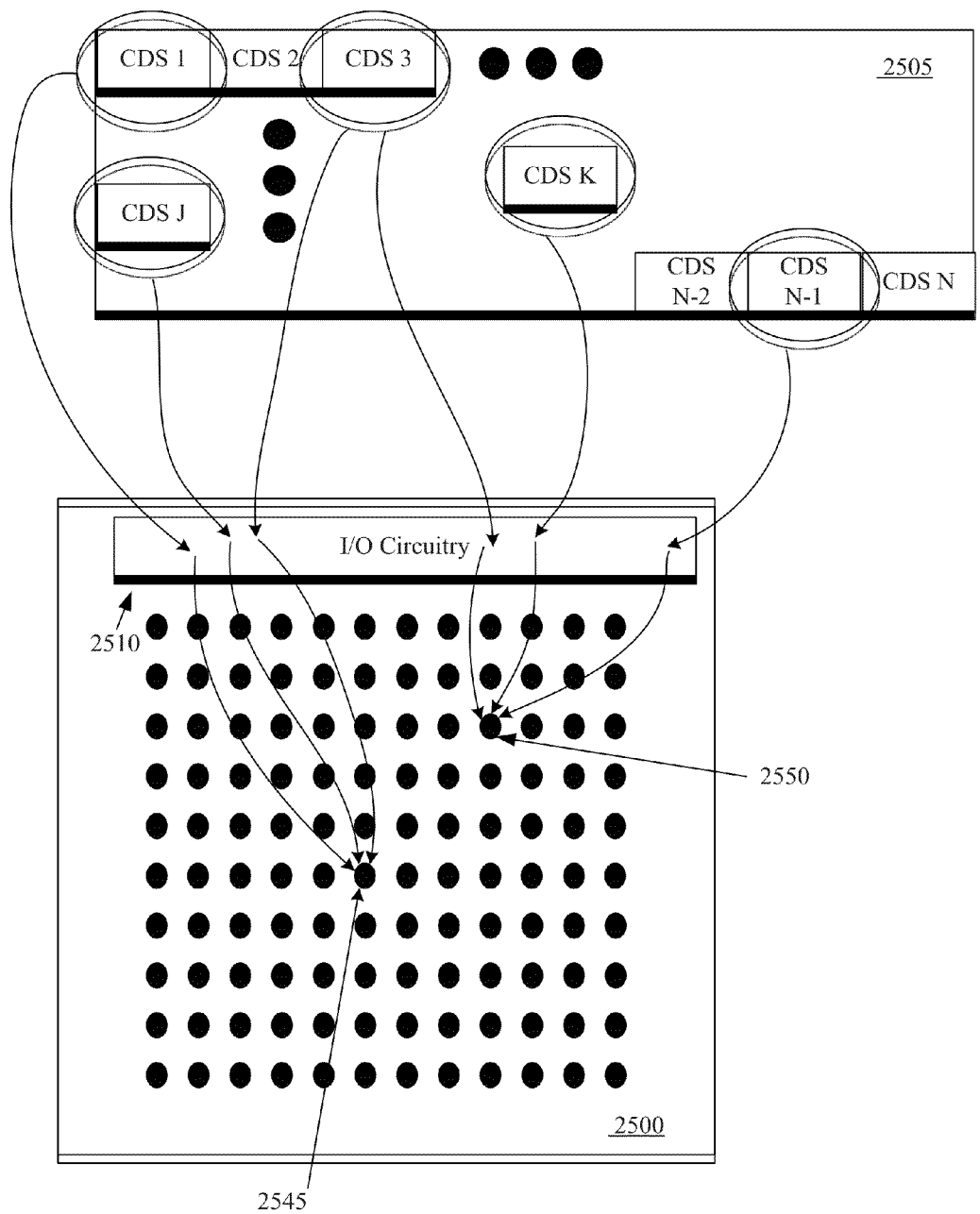
FIG. 25 illustrates a more detailed example of a configurable IC.

The data also includes in some embodiments a set of configuration data that configures the nodes to perform particular operations. FIG. 25 illustrates a more detailed example of this. Specifically, this figure illustrates a configuration data pool 2505 for the configurable IC 2500. This pool includes N configuration data sets ("CDS"). As shown in FIG. 25, the input/output circuitry 2510 of the configurable IC 2500 routes different configuration data sets to different configurable nodes of the IC 2500. For instance, FIG. 25 illustrates configurable node 2545 receiving configuration data sets 1, 3, and J through the I/O circuitry, while configurable node 2550 receives configuration data sets 3, K, and N−1 through the I/O circuitry. In some embodiments, the configuration data sets are stored within each configurable node. Also, in some embodiments, a configurable node can store multiple configuration data sets for a configurable circuit within it so that this circuit can reconfigure quickly by changing to another configuration data set for a configurable circuit. In some embodiments, some configurable nodes store only one configuration data set, while other configurable nodes store multiple such data sets for a configurable circuit.

Figure 26:
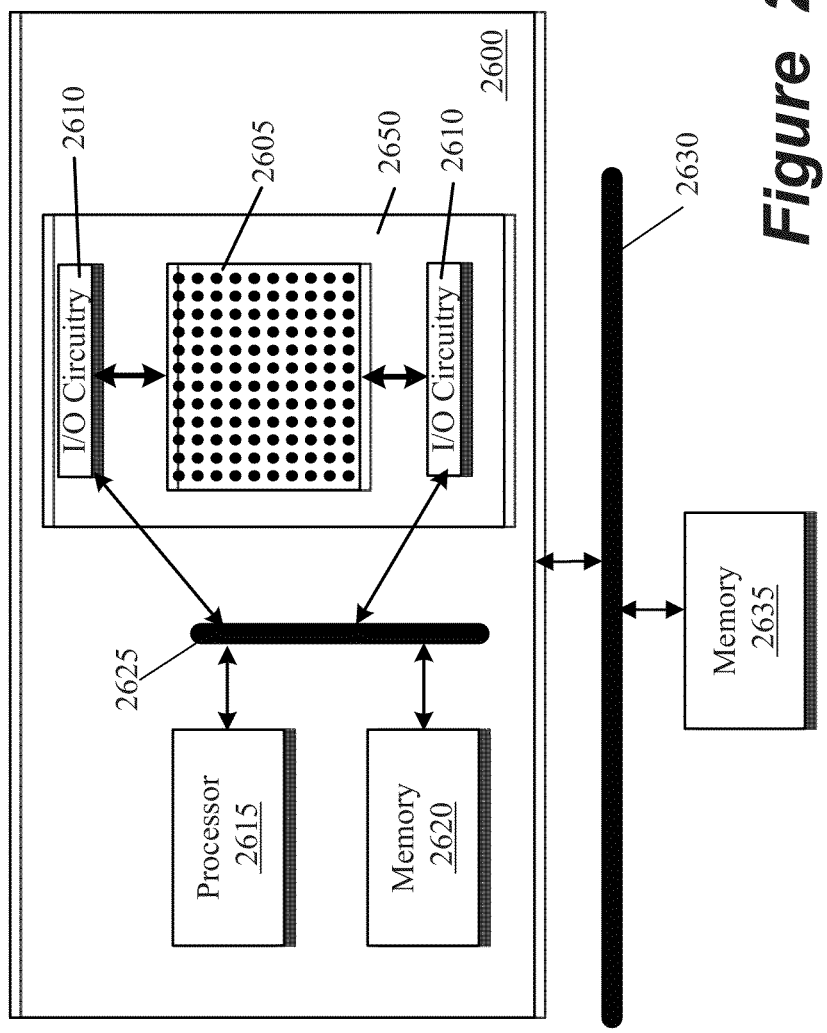
FIG. 26 illustrates a system on chip ("SoC") implementation of a configurable IC.

A configurable IC of the invention can also include circuits other than a configurable circuit arrangement and I/O circuitry. For instance, FIG. 26 illustrates a system on chip ("SoC") implementation of a configurable IC 2600. This IC has a configurable block 2650, which includes a configurable circuit arrangement 2605 and I/O circuitry 2610 for this arrangement. It also includes a processor 2615 outside of the configurable circuit arrangement, a memory 2620, and a bus 2625, which conceptually represents all conductive paths between the processor 2615, memory 2620, and the configurable block 2650. As shown in FIG. 26, the IC 2600 couples to a bus 2630, which communicatively couples the IC to other circuits, such as an off-chip memory 2635. Bus 2630 conceptually represents all conductive paths between the system components.

This processor 2615 can read and write instructions and/or data from an on-chip memory 2620 or an off-chip memory 2635. The processor 2615 can also communicate with the configurable block 2650 through memory 2620 and/or 2635 through buses 2625 and/or 2630. Similarly, the configurable block can retrieve data from and supply data to memories 2620 and 2635 through buses 2625 and 2630.

Figure 27:
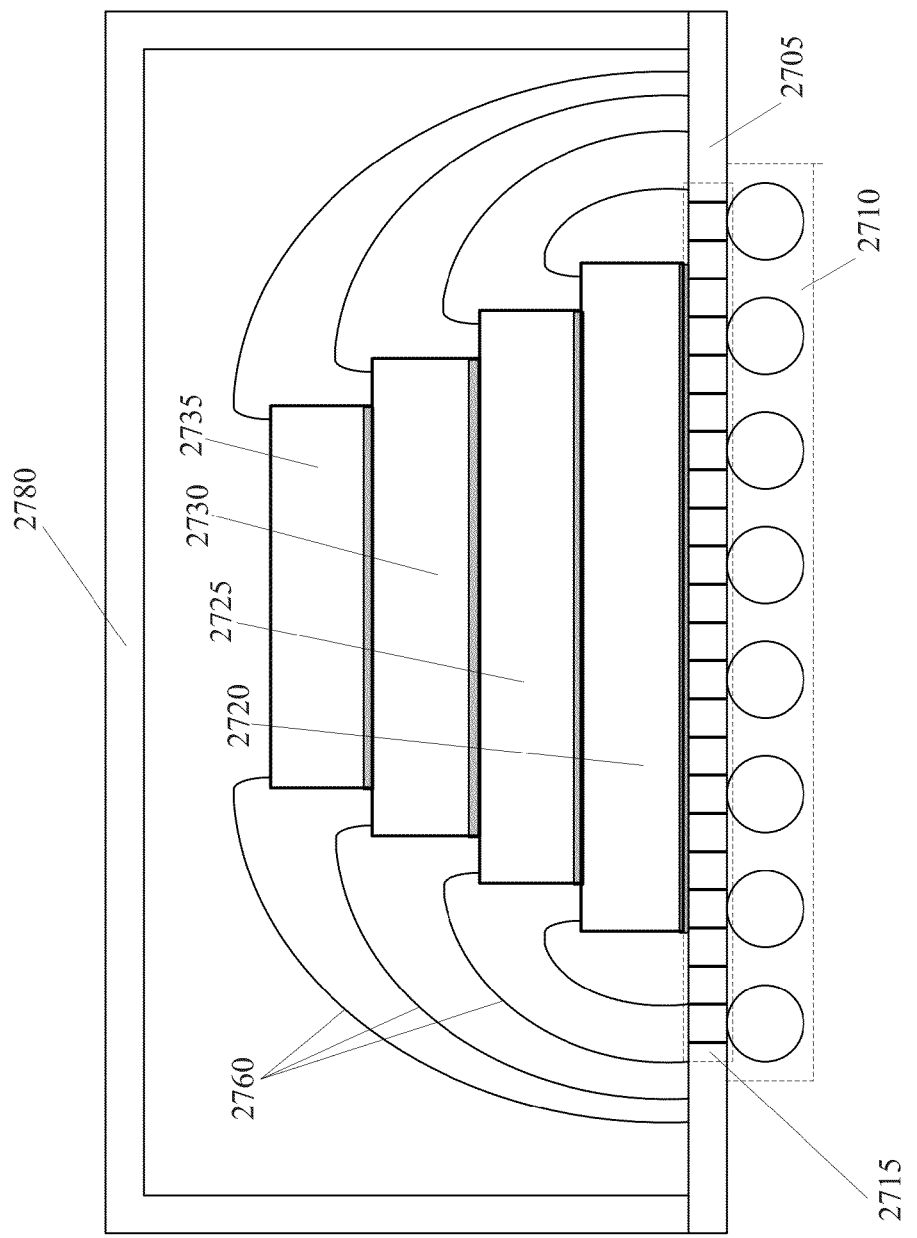
FIG. 27 illustrates a system in a package ("SiP").

Instead of, or in conjunction with, the system on chip ("SoC") implementation for a configurable IC, some embodiments might employ a system in package ("SiP") implementation for a configurable IC. FIG. 27 illustrates one such SiP 2700. As shown in this figure, SiP 2700 includes four ICs 2720, 2725, 2730, and 2735 that are stacked on top of each other on a substrate 2705. At least one of these ICs is a configurable IC that includes a configurable block, such as the configurable block 2650 of FIG. 26. Other ICs might be other circuits, such as processors, memory, etc.

As shown in FIG. 27, the IC communicatively connects to the substrate 2705 (e.g., through wire bondings 2760). These wire bondings allow the ICs 2720-3235 to communicate with each other without having to go outside of the SiP 2700. In some embodiments, the ICs 2720-3235 might be directly wire-bonded to each other in order to facilitate communication between these ICs. Instead of, or in conjunction with the wire bondings, some embodiments might use other mechanisms to communicatively couple the ICs 2720-3235 to each other.

As further shown in FIG. 27, the SiP includes a ball grid array ("BGA") 2710 and a set of vias 2715. The BGA 2710 is a set of solder balls that allows the SiP 2700 to be attached to a printed circuit board ("PCB"). Each via connects a solder ball in the BGA 2710 on the bottom of the substrate 2705, to a conductor on the top of the substrate 2705.

The conductors on the top of the substrate 2705 are electrically coupled to the ICs 2720-3235 through the wire bondings. Accordingly, the ICs 2720-3235 can send and receive signals to and from circuits outside of the SiP 2700 through the wire bondings, the conductors on the top of the substrate 2705, the set of vias 2715, and the BGA 2710. Instead of a BGA, other embodiments might employ other structures (e.g., a pin grid array) to connect a SiP to circuits outside of the SiP. As shown in FIG. 27, a housing 2780 encapsulates the substrate 2705, the BGA 2710, the set of vias 2715, the ICs 2720-3235, the wire bondings to form the SiP 2700. This and other SiP structures are further described in U.S. patent application Ser. No. 11/081,820, now issued as U.S. Pat. No. 7,530,044, entitled "Method for Manufacturing A Programmable System In Package", which is incorporated herein by reference.

Figure 28:
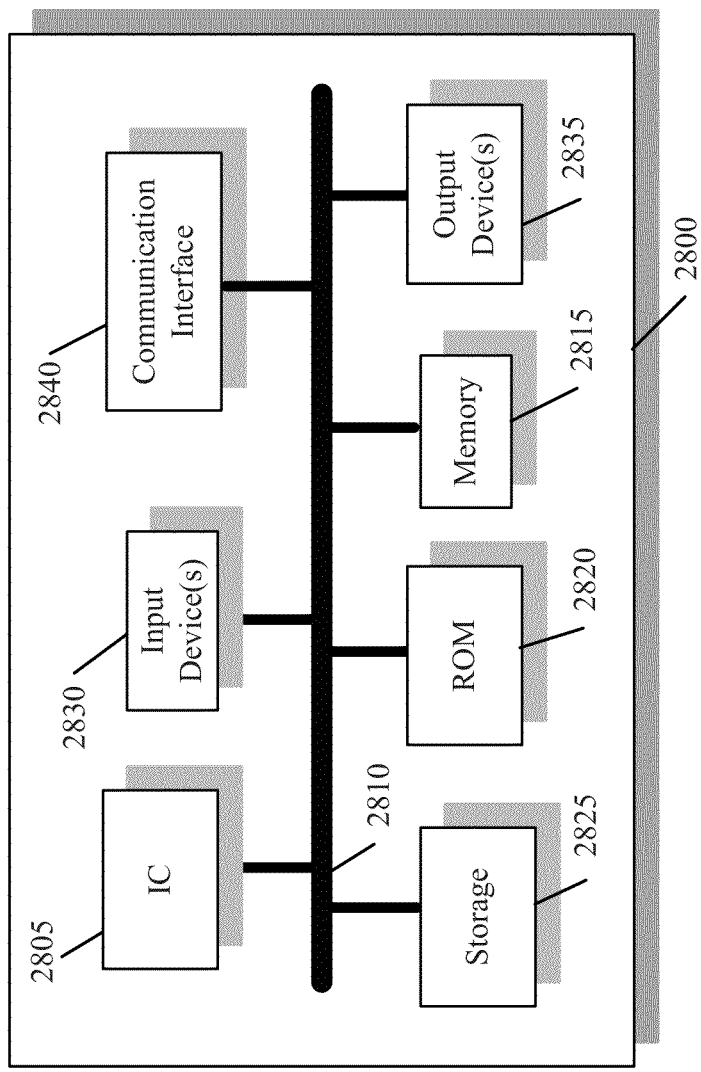
FIG. 28 conceptually illustrates an example of a computing system.

FIG. 28 conceptually illustrates a more detailed example of a computing system 2800 that has an IC 2805, which includes a configurable circuit arrangement with configurable circuits, storage elements, and routing fabric of some embodiments of the invention that were described above. The system 2800 can be a stand-alone computing or communication device, or it can be part of another electronic device. As shown in FIG. 28, the system 2800 not only includes the IC 2805, but also includes a bus 2810, a system memory 2815, a read-only memory 2820, a storage device 2825, input device(s) 2830, output device(s) 2835, and communication interface 2840.

The bus 2810 collectively represents all system, peripheral, and chipset interconnects (including bus and non-bus interconnect structures) that communicatively connect the numerous internal devices of the system 2800. For instance, the bus 2810 communicatively connects the IC 2810 with the read-only memory 2820, the system memory 2815, and the permanent storage device 2825. The bus 2810 may be any of several types of bus structure including a memory bus or memory controller, a peripheral bus, and a local bus using any of a variety of conventional bus architectures. For instance, the bus 2810 architecture may include any of the following standard architectures: PCI, PCI-Express, VESA, AGP, Microchannel, ISA and EISA, to name a few.

From these various memory units, the IC 2805 receives data for processing and configuration data for configuring the ICs configurable logic and/or interconnect circuits. When the IC 2805 has a processor, the IC also retrieves from the various memory units instructions to execute. The read-only-memory (ROM) 2820 stores static data and instructions that are needed by the IC 2805 and other modules of the system 2800.

Some embodiments of the invention use a mass-storage device (such as a magnetic disk to read from or write to a removable disk or an optical disk for reading a CD-ROM disk or to read from or write to other optical media) as the permanent storage device 2825. Other embodiments use a removable storage device (such as a flash memory card or memory stick) as the permanent storage device. The drives and their associated computer-readable media provide non-volatile storage of data, data structures, computer-executable instructions, etc. for the system 2800. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 2825, the system memory 2815 is a read-and-write memory device. However, unlike storage device 2825, the system memory is a volatile read-and-write memory, such as a random access memory. Typically, system memory 2815 may be found in the form of random access memory (RAM) modules such as SDRAM, DDR, RDRAM, and DDR-2. The system memory stores some of the set of instructions and data that the processor needs at runtime.

The bus 2810 also connects to the input and output devices 2830 and 2835. The input devices enable the user to enter information into the system 2800. The input devices 2830 can include touch-sensitive screens, keys, buttons, keyboards, cursor-controllers, touch screen, joystick, scanner, microphone, etc. The output devices 2835 display the output of the system 2800. The output devices include printers and display devices, such as cathode ray tubes (CRT), liquid crystal displays (LCD), organic light emitting diodes (OLED), plasma, projection, etc.

Finally, as shown in FIG. 28, bus 2810 also couples system 2800 to other devices through a communication interface 2840. Examples of the communication interface include network adapters that connect to a network of computers, or wired or wireless transceivers for communicating with other devices. Through the communication interface 2840, the system 2800 can be a part of a network of computers (such as a local area network ("LAN"), a wide area network ("WAN"), or an Intranet) or a network of networks (such as the Internet). The communication interface 2840 may provide such connection using wireless techniques, including digital cellular telephone connection, Cellular Digital Packet Data (CDPD) connection, digital satellite data connection or the like.

While the invention has been described with reference to numerous specific details, one of ordinary skill in the art will recognize that the invention can be embodied in other specific forms without departing from the spirit of the invention. For example, many of the storage circuits can be used in ICs other than the ones described above, including ICs that do not include configurable circuits (e.g., pure ASICs, processors, etc.). Thus, one of ordinary skill in the art would understand that the invention is not to be limited by the foregoing illustrative details, but rather is to be defined by the appended claims.

What is claimed is:

1. An integrated circuit (IC) comprising:
   a plurality of clock sources;
   a plurality of clock domains, wherein each clock domain of the plurality of clock domains comprises:
   a clock signal that is configurably selected from the plurality of clock sources;
   a clock management block (CMB) for providing a control signal that is synchronized with the clock signal;

a first physical distribution network for distributing the clock signal within the clock domain; and
a second physical distribution network for distributing the control signal within the clock domain; and
a plurality of configurable circuits, wherein each of the plurality of configurable circuits is configurable to operate in one of the plurality of clock domains by using a distributed control signal and a distributed clock signal of the one of the plurality of clock domains.

2. The IC of claim 1, wherein the plurality of clock sources comprise a first clock source and a second clock source, wherein the plurality of clock domains comprise a first clock domain, a second clock domain and a third clock domain, wherein the first clock domain and the second clock domain are configured to route from the first clock source and the third clock domain is configured to route from the second clock source.

3. The IC of claim 2, wherein the first clock source and the second clock source have different frequencies.

4. The IC of claim 2, wherein the first clock source and the second clock source have a same frequency but at different phases.

5. The IC of claim 2, wherein the first clock source and the second clock source are different outputs of a same phase lock loop (PLL).

6. The IC of claim 2, wherein the second clock source is a divided clock based on the first clock source.

7. The IC of claim 2, wherein a first configurable circuit configured to operate in the first clock domain and a second configurable circuit configured to operate in the second clock domain are configured to be in a same functional module.

8. The IC of claim 1 further comprising a plurality of clock regions, each clock region comprising a subset of the plurality of clock domains and a subset of the plurality of configurable circuits, wherein each particular configurable circuit in a clock region selectively operates in one of the subset of the plurality of clock domains in the clock region.

9. The IC of claim 8, wherein one or more of the plurality of clock sources are regional clock sources, wherein a clock source is a regional clock source when only clock domains of one clock region can configurably select the regional clock source.

10. The IC of claim 9, wherein one or more of the plurality of clock sources are global clock sources, wherein a clock source is a global clock source when clock domains in different clock regions can configurably select the global clock source.

11. An electronic device comprising:
an oscillatory circuit for providing a reference clock;
an integrated circuit (IC) comprising:
a plurality of clock sources, wherein at least one of the plurality of clock sources is based on the reference clock;
a plurality of clock domains, wherein each clock domain of the plurality of clock domains comprises:
a clock signal that is configurably selected from the plurality of clock sources;
a clock management block (CMB) for providing a control signal that is synchronized with the clock signal;
a first physical distribution network for distributing the clock signal within the clock domain; and
a second physical distribution network for distributing the control signal within the clock domain; and
a plurality of configurable circuits, wherein each of the plurality of configurable circuits is configurable to operate in one of the plurality of clock domains by using a distributed control signal and a distributed clock signal of the one of the plurality of clock domains.

12. The electronic device of claim 11, wherein the plurality of clock sources comprise a first clock source and a second clock source, wherein the plurality of clock domains comprise a first clock domain, a second clock domain and a third clock domain, wherein the first clock domain and the second clock domain are configured to route from the first clock source and the third clock domain is configured to route from the second clock source.

13. For an integrated circuit (IC) comprising a plurality of configurable circuits and a plurality of clock sources, a method comprising:
configuring a particular clock domain by configurably selecting a clock signal from the plurality of clock sources, the particular clock domain comprising (i) a clock management block (CMB) for providing a control signal that is synchronized with the clock signal, (ii) a first physical distribution network for distributing the clock signal within the particular clock domain, and (iii) a second physical distribution network for distributing the control signal within the particular clock domain; and
configuring a plurality of configurable circuits to operate in the particular clock domain, wherein each of the plurality of configurable circuits uses the distributed control signal and the distributed clock signal of the particular clock domain.

14. The electronic device of claim 12, wherein the first clock source and the second clock source have different frequencies.

15. The electronic device of claim 12, wherein the first clock source and the second clock source have a same frequency but at different phases.

16. The electronic device of claim 12, wherein the first clock source and the second clock source are different outputs of a same phase lock loop (PLL).

17. The IC of claim 1, wherein the control signal controls operations of the configurable circuits in the one of the plurality of clock domains.

18. The IC of claim 1, wherein the control signal is a reset signal for resetting the configurable circuits in the one of the plurality of clock domains.

19. The IC of claim 1, wherein the control signal is an enable signal for halting or enabling operations of the configurable circuits in the one of the plurality of clock domains.

* * * * *